United States Patent
Nagata et al.

[11] Patent Number: 5,977,756
[45] Date of Patent: *Nov. 2, 1999

[54] DRIVING APPARATUS FOR AN INDUCTIVE LOAD

[75] Inventors: Junichi Nagata; Junji Hayakawa, both of Okazaki; Hiroyuki Ban, Aichi-ken, all of Japan

[73] Assignee: Denso Corporation, Kariya, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/042,191

[22] Filed: Mar. 13, 1998

[30] Foreign Application Priority Data

Mar. 13, 1997 [JP] Japan ................... 9-059609
Jan. 14, 1998 [JP] Japan ................... 10-005973
Jan. 14, 1998 [JP] Japan ................... 10-006160

[51] Int. Cl.[6] .......................................... G05F 1/44
[52] U.S. Cl. ........................................... 323/282
[58] Field of Search ....................... 323/282, 351, 323/319; 363/17; 327/365

[56] References Cited

U.S. PATENT DOCUMENTS

| | | | |
|---|---|---|---|
| 4,429,359 | 1/1984 | Anderson | 363/132 |
| 5,420,532 | 5/1995 | Teggatz et al. | 327/365 |
| 5,519,311 | 5/1996 | Widmayer | 323/319 |

FOREIGN PATENT DOCUMENTS

| | | |
|---|---|---|
| 2-280675 | 11/1990 | Japan . |
| 3-141721 | 6/1991 | Japan . |

OTHER PUBLICATIONS

"Multifunction Injection Interface", Oct. 1991, pp. 1/11 to 11/11.

*Primary Examiner*—Adolf Deneke Berhane
*Attorney, Agent, or Firm*—Pillsbury, Madison & Sutro LLP

[57] ABSTRACT

A first switching element opens or closes a power supply route of an inductive load in accordance with a first driving signal. A clamping element prevents a voltage ot the power supply route from exceeding a first clamp voltage when the power supply route is opened. A second switching element opens or closes the current flow route, provided in parallel with the power supply route, in response to a second driving signal. A rectifying means is responsive to the second switching element to change the clamp voltage to a second clamp voltage when the first switching element is turned off. The second switching element is constituted by a MOSFET. A charging element charges a capacitor of MOSFET.

16 Claims, 8 Drawing Sheets

DRIVING APPARATUS FOR AN INDUCTIVE LOAD

BACKGROUND OF THE INVENTION

The present invention relates to a driving apparatus for an inductive load, which is applicable to an electric power supply control system for an inductive load such as an electromagnetic valve or a motor.

According to a fundamental arrangement of a conventional driving apparatus for an inductive load, a switching element is provided in a power supply route extending from a power source to the inductive load. This switching element is on/off controlled in accordance with a driving signal.

SUMMARY OF THE INVENTION

An object of the present invention is to provide an excellent inductive load driving apparatus which is capable of suppressing heat generation from a circuit component (especially, from a rectifying element) involved in the driving apparatus. Another object of the present invention is to provide an excellent inductive load driving apparatus which is capable of reducing the loss in the circuit and simplifying a circuit arrangement. Furthermore, another object of the present invention is to provide an excellent inductive load driving apparatus which is capable of suppressing manufacturing costs, increasing reliability, and realizing an IC unit of the driving apparatus.

In order to accomplish this and other related objects, one aspect of the present invention provides an inductive load driving apparatus comprising a first switching element provided in a power supply route extending from a DC power source to an inductive load for opening or closing the power supply route in accordance with a first driving signal. A clamping means is provided for preventing a voltage between both ends of the power supply route from exceeding a first clamp voltage when the power supply route is opened in response to a turn-off of the first switching element. A current flow route is connected in parallel with the inductive load. A second switching element is provided for opening or closing the current flow route in response to a second driving signal. A rectifying means is provided for allowing current to flow along the current flow route by a voltage produced at one end of the inductive load closer to the first switching element in response to the turning-off of the first switching element, when the second switching element is turned on to change the voltage between both ends of the power supply route from the first clamp voltage to a second clamp voltage lower than the first clamp voltage. The second switching element and the rectifying element are provided in the current flow route. The second switching element is constituted by a MOSFET having a first output terminal connected to the one end of the inductive load closer to the first switching element and a second output terminal connected via the rectifying element to the other end of the inductive load. A charging means is provided for allowing current to flow into a control terminal of the MOSFET when the second driving signal is a voltage signal for activating the MOSFET, and charging a capacitor formed between the output terminal and the control terminal of the MOSFET.

Preferably, the inductive load driving apparatus further comprises a discharging means connected to the control terminal of the MOSFET for discharging electric charge stored in the capacitor of the MOSFET when the second driving signal is a voltage signal for deactivating the MOSFET. The first switching element and the clamping means are integrated into a single switching element. The first switching element is provided in a power supply route extending from the inductive load to a lower-voltage side of the DC power source, and the second switching element is an n-channel MOSFET. Alternatively, the first switching element is provided in a power supply route extending from a higher-voltage side of the DC power source to the inductive load, and the second switching element is a p-channel MOSFET. Furthermore, the charging means is a rectifying element provided between an input terminal of the second driving signal and the control terminal of the MOSFET. The charging means comprises a third switching element provided between the DC power source and the control terminal of the MOSFET, and current flows in a predetermined direction across the third switching element when the second driving signal is a voltage signal for activating the MOSFET.

Another aspect of the present invention provides an inductive load driving apparatus comprising a first switching element provided in a power supply route extending from a DC power source to an inductive load for opening or closing the power supply route in accordance with a first driving signal. A rectifying element is connected in parallel with the inductive load for allowing current to flow across the inductive load by a voltage produced at one end of the inductive load closer to the first switching element. This voltage is produced when a power supply to the inductive load is stopped in response to a turning-off operation of the first switching element. A single MOSFET, having a pair of output terminals, is connected to both ends of the rectifying element. A first capacitance element is provided for storing electric charge. One end of the first capacitance element is connected to the one end of the inductive load closer to the first switching element. A rectifying means is provided for allowing current to flow in a predetermined direction for charging the first capacitance element by a voltage supplied from the DC power source when the first switching element is turned on. One end of the rectifying means is connected to the other terminal of the first capacitance element, and the other terminal of the rectifying means is connected to the other end of the inductive load far from the first switching element. A second switching element is provided for turning the MOSFET on by applying a voltage to a control terminal of the MOSFET from a connecting point between the first capacitance element and the rectifying element. The second switching element is turned on in response to a second driving signal entered to a control terminal when the first switching element is turned on. One output terminal of the second switching element is connected to the connecting point between the first capacitance element and the rectifying means. The other output terminal of the second switching element is connected to the control terminal of the MOSFET. And, a discharging means is provided for turning the MOSFET off by discharging electric charge of the MOSFET when the second switching element is turned off in response to a stop of the second driving signal. The electric charge has been stored between the control terminal and the output terminal of the MOSFET by the application of the voltage during a turned-on condition of the second switching element.

Preferably, the rectifying element is constituted by a parasitic diode formed between the output terminals of the MOSFET when the MOSFET is manufactured. The inductive load driving apparatus further comprises a second capacitance element having one end connected to the connecting point between the rectifying means and the first capacitance element and the other end connected to the control terminal of the second switching element, so as to prevent the second switching element from malfunctioning due to a potential change of the connecting point between the rectifying means and the first capacitance element. The discharging means comprises a third switching element provided in a discharge route of the electric charge and a driving means for causing the third switch to turn on to discharge the electric charge when the second driving signal is stopped. The inductive load driving apparatus further comprises a driving signal generating means for alternately generating the first driving signal and the second driving signal with predetermined time delays in response to a control signal entered for opening and closing the power supply route to the inductive load. More specifically, the driving signal generating means comprises a charge/discharge circuit for charging and discharging a third capacitance element in accordance with the control signal, and a pair of comparators for comparing a voltage of the third capacitance element with a first reference voltage and a second reference voltage different from each other, thereby alternately producing the first driving signal and the second driving signal in response to the control signal.

Furthermore, another aspect of the present invention provides an inductive load driving apparatus comprising a first switching element provided in a power supply route extending from a DC power source to an inductive load for opening or closing the power supply route in accordance with a first driving signal. A current route forming means is connected in parallel with the inductive load for providing a current flow route allowing current to flow during a turned-off condition of the first switching element. The rectifying means includes a MOSFET. A driving circuit is provided for activating the rectifying means in response to a second driving signal. The driving circuit includes a capacitance element having one end connected to a connecting point between the inductive load and the first switching element and the other end connected to a control terminal of the MOSFET.

BRIEF DESCRIPTION OF THE DRAWINGS

The above and other objects, features and advantages of the present invention will become more apparent from the following detailed description which is to be read in conjunction with the accompanying drawings, in which.

DESCRIPTION OF THE PREFERRED EMBODIMENTS

Figure 1A:
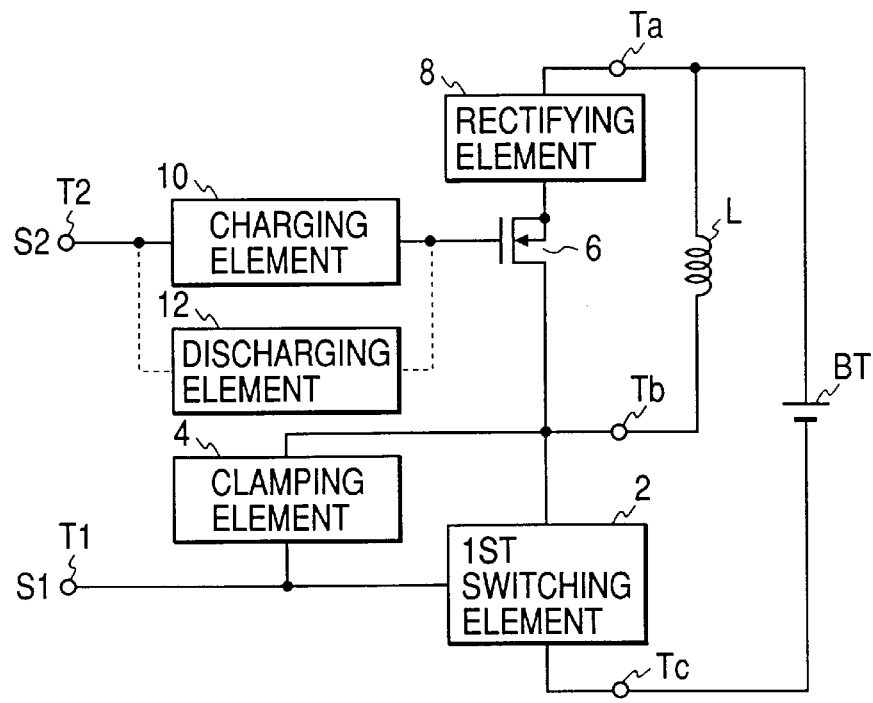
FIGS. 1A and 1B are schematic block diagrams respectively showing an arrangement of an inductive load driving apparatus in accordance with the present invention.

Preferred embodiments of the present invention will be explained hereinafter with reference to accompanied drawings. Identical parts are denoted by the same reference numerals throughout the drawings.

Inductive Load Driving Apparatus

Figure 1B:
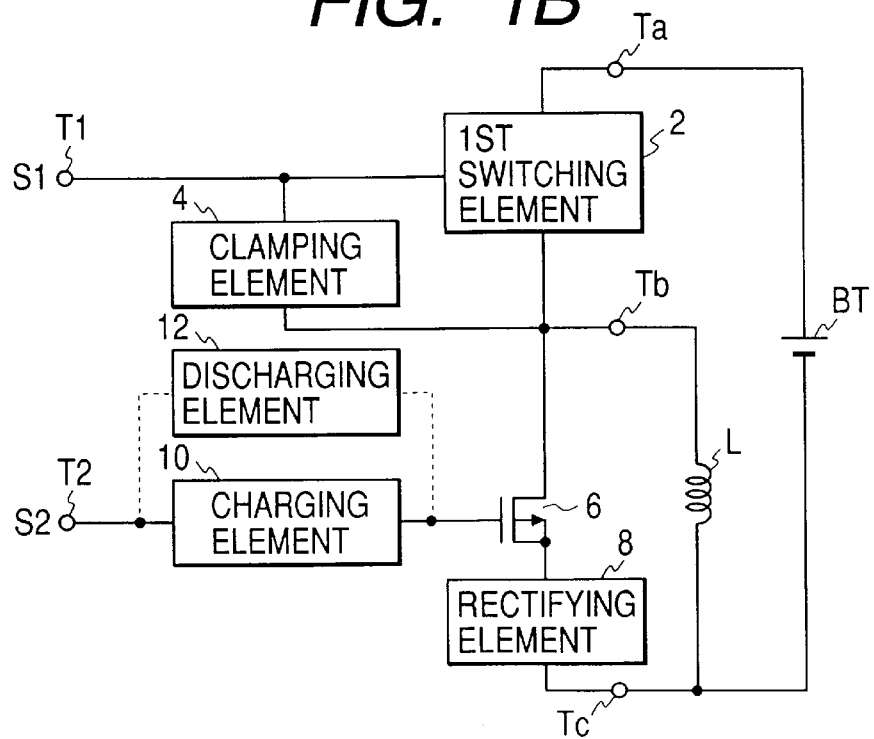

FIGS. 1A and 1B respectively show a schematic arrangement of an inductive load driving apparatus in accordance with the present invention.

A first switching element 2 is provided in a power supply route extending from a DC power source BT to an inductive load L for opening or closing the power supply route in accordance with a first driving signal. A clamping element 4 is provided for preventing a voltage between both ends of the power supply route from exceeding a first clamp voltage when the power supply route is opened in response to a turn-off of the first switching element. A current flow route is connected in parallel with the inductive load L. A second switching element 6 and a rectifying element 8 are serially connected in this current flow route. The second switching element opens or closes the current flow route in response to a second driving signal. The rectifying element 8 allows current to flow along the current flow route by a voltage produced at an end (i.e., terminal Th) of the inductive load L closer to the first switching element 2 in response to the turning-off of the first switching element 2, when the second switching element is turned on.

Accordingly, by maintaining the second switching element 6 in a turned-on condition, the inductive load driving apparatus of the present invention switches the voltage between the both ends of the power supply route to a second clamp voltage which is lower than the first clamp voltage.

Furthermore, according to the inductive load driving apparatus of the present invention, the second switching element 6 has a function of switching a clamp voltage. Preferably, the switching element 6 is a MOSFET (i.e., metal oxide semiconductor field-effect transistor) having a first output terminal (e.g., a drain) connected to the terminal Tb of the inductive load L and a second output terminal (e.g., source) connected via the rectifying element 8 to the other end (i.e., terminal Ta or Tc) of the inductive load L closer to the DC power source BT. Moreover, MOSFET 6 has a control terminal (i.e., gate) inputting a voltage signal as the second driving signal for turning MOSFET 6 on. A charging element 10 is provided for allowing current to flow in one direction for turning MOSFET 6 on and charging a capacitor formed between the control terminal and each output terminal (i.e., a gate-source capacitor or a gate-drain capacitor) of MOSFET 6.

Accordingly, the present invention makes it possible to change the clamp voltage by the second switching element 6. In addition, the second switching element 6, constituted by a MOSFET, can effectively reduce the current loss caused during a turning-on operation of the second switching element 6, suppressing an overall loss in the inductive load driving apparatus. Furthermore, the arrangement of the present invention can be realized by a simplified circuit.

Hereinafter, this will be explained in more detail.

When the second switching element 6 is constituted by a MOSFET, there is a necessity of controlling the gate potential of MOSFET to have a potential difference equal to or larger than a predetermined threshold voltage $V_{TH}$ with respect to the source potential.

For example, when an n-channel MOSFET is used as the second switching element 6 as shown in FIG. 1A, the gate potential needs to be higher than the source potential by an amount equal to or larger than the threshold voltage $V_{TH}$. On the other hand, when a p-channel MOSFET is used as the second switching element 6 as shown in FIG. 1B, the gate potential needs to be lower than the source potential by an amount equal to or larger than the threshold voltage $V_{TH}$.

In a MOSFET driving system, the second driving signal (voltage) is entered into an input terminal T2. If the second driving signal is directly applied to the gate of MOSFET, the second driving signal needs to be a higher voltage signal having a predetermined electric potential higher than a value obtained by adding a voltage drop at the rectifying element 8 and a threshold voltage of MOSFET to a higher-voltage potential of the DC power source BT (i.e., an electric potential at a terminal Ta). This is applicable to an n-channel MOSFET. Otherwise, the second driving signal needs to be a lower voltage signal having a predetermined electric potential lower than a value obtained by subtracting the voltage drop at the rectifying element 8 and the threshold voltage of MOSFET from the lower-voltage potential of the DC power source BT (i.e., an electric potential at a terminal Tc). This is applicable to a p-channel MOSFET. To this end, a special circuit is required for boosting or increasing the power source voltage.

However, according to the present invention, the charging element 10 is connected to the control terminal (i.e., gate) of MOSFET 6. When the first switching element 2 is turned on, the first output terminal of MOSFET 6 is connected to the lower-voltage side (or higher-voltage side) of the DC power source BT. In this condition, a voltage signal having an electric potential higher than the lower-voltage potential of the DC power source BT (or a voltage signal having an electric potential lower than the higher-voltage potential of the DC power source BT) is entered into the charging element 10. Input of this voltage signal allows current to flow across the charging element 10 in a predetermined direction for turning MOSFET 6 on. This current flow charges the capacitor between the control terminal and the first output terminal of MOSFET 6.

When MOSFET 6 is turned off, no current flows across the rectifying element 8. The rectifying element 8 completely isolates the second output terminal of the first switching element 2 from the DC power source BT. The capacitor between the control terminal and the second output terminal of MOSFET 6 is charged in the same manner. The first output terminal is connected via the first switching element 2 to the lower-voltage terminal of the DC power source BT. A voltage signal for turning on MOSFET 6 is entered into the charging element 10. This voltage signal is higher than the electric potential of the lower-voltage terminal of the DC power source BT by an amount equal to or larger than the threshold voltage of MOSFET 6 (or lower than the electric potential of the higher-voltage terminal of the DC power source BT by an amount equal to or larger than the threshold voltage of MOSFET 6). In response to the input of this voltage signal, the gate-source voltage of MOSFET 6 becomes equal to or larger than the threshold voltage. Thus, MOSFET 6 is turned on.

After MOSFET 6 is turned on, MOSFET 6 can maintain its turned-on condition even when the first switching element 2 is turned off. More specifically, if the Th terminal closer to the first output terminal has an electric potential increased (or decreased) in response to the deactivation of the first switching element 2, the control terminal will have a corresponding variation in its electric potential. This maintains the gate-source voltage of MOSFET 6 so as to continuously turn MOSFET 6 on.

Accordingly, according to the present invention, the voltage signal used for activating MOSFET 6 needs not to have an electric potential higher than the higher-voltage potential of the DC power source BT or an electric potential lower than the lower-voltage potential of the DC power source BT. Thus, the driving system of MOSFET 6 can be simplified.

The capacitor between the control terminal and each output terminal includes a parasitic capacitance between terminals.

According to the inductive load driving apparatus of the present invention, the second switching element 6 is constituted by MOSFET for switching the clamp voltage. When this driving apparatus is incorporated in a semiconductor integrated circuit, sufficient current flows across the second switching element. On the other hand, a conventional driving apparatus using a PNP transistor as the second switching element needs to enlarge a chip area to secure sufficient current flowing across the PNP transistor. Hence, the present invention easily realize an integrated circuit for the driving apparatus.

Furthermore, according to the present invention, the clamp voltage is switched from the first clamp voltage to the second clamp voltage by turning on MOSFET 6. The clamp voltage can be returned to the first clamp voltage again by discharging the capacitor between the control terminal and each output terminal of MOSFET 6 so as to deactivate MOSFET 6.

To this end, it is preferable to connect a discharging element 12 between the terminal T2 and the MOSFET 6 in parallel with the charging element 10 as shown in FIGS. 1A and 1B. With the provision of the discharging element 12, the clamp voltage can be alternately switched from the first clamp voltage to the second clamp voltage or vice versa during the power supply control of the inductive load L. Namely, when the second driving signal is entered from the terminal T2 as a voltage signal for deactivating the MOSFET 6, the capacitor of the MOSFET 6 is discharged by the function of discharging element 12.

According to this arrangement, the discharging element 12 discharges the capacitor of the MOSFET 6 in response to the voltage signal entered as the second driving signal for deactivating the MOSFET 6. Thus, the MOSFET 6 can be quickly turned off. The clamp voltage can be alternately switched between the first clamp voltage and the second clamp voltage even when of the inductive load L is under the power supply control.

Furthermore, in FIGS. 1A and 1B, the clamping element 4 is interposed between a terminal T1, which is a terminal provided for supplying the first driving signal to the first switching element 2, and the terminal Tb. However, the clamping element 4 can be directly connected between the terminal Tb and the terminal Tc.

More specifically, in the case the clamping element 4 is provided between the terminal T1 and the terminal Tb, the first switching element 2 is turned on by a positive or negative high voltage generated at the terminal Tb when the inductive load L is supplied no power. This provides the predetermined first clamp voltage between the terminals Tb and Tc. The same thing can be realized by directly connecting the clamping element 4 between the terminals Tb and Tc.

Moreover, there is no necessity of separating the clamping element 4 from the first switching element 2. For example, the function of the clamping element 4 can be realized by the first switching element 2. Usually, the first switching element 2 is constituted by a transistor. When this transistor has a withstand voltage equivalent to the first clamp voltage, the voltage between the terminals Tb and Tc can be clamped to the first clamp voltage by the withstand voltage of the first switching element 2. This arrangement fairly simplifies the arrangement of the driving apparatus, because there is no necessity of providing several circuit elements, such as a Zener diode.

Preferably, the second switching element 6 used for changing the clamp voltage is an n-channel MOSFET when the first switching element 2 is provided as a so-called lower-side switch in a power supply route extending from the inductive load L1 to the lower-voltage side (i.e., terminal Tc) of the DC power source BT, as shown in FIG. 1A.

On the other hand, the second switching element 6 is a p-channel MOSFET when the first switching element 2 is provided as a so-called higher-side switch in a power supply route extending from the higher-voltage side (i.e., terminal Ta) of the DC power source BT to the inductive load L1, as shown in FIG. 1B.

The clamp voltage switching operation in the above-described driving apparatus will be explained hereinafter in greater detail.

The driving apparatus shown in FIG. 1A is applicable to the n-channel MOSFET used as the second switching element 6. When the first switching element 2 is turned on, the drain (i.e., the first output terminal) of the n-channel MOSFET 6 is connected to the terminal Tc (i.e., the lower-voltage side of the DC power source BT) via the first switching element 2. In other words, the drain of the n-channel MOSFET 6 has the same electric potential as that of the lower-voltage side of the DC power source BT. A parasitic diode is formed between the output terminals (i.e., drain-source) of the n-channel MOSFET 6. Therefore, the source (i.e., the second output terminal) of the n-channel MOSFET 6 has substantially the same electric potential as that of the lower-voltage side of the DC power source BT. The second driving signal entered from the terminal T2 is a voltage signal having an electric potential equal to or higher than a value obtained by adding the threshold voltage $V_{TH}$ of the n-channel MOSFET 6 to the lower-voltage potential of the DC power source BT. In response to the input of the second driving signal, current flows into the control terminal (i.e., gate) of the n-channel MOSFET 6 via the charging element 10 when the first switching element 2 is turned on. This increases the gate potential to a higher level equal to or larger than a value equivalent to the source potential plus threshold voltage $V_{TH}$. Thus, the n-channel MOSFET 6 is turned on. An electric charge is stored in the capacitor of the n-channel MOSFET 6 to keep the n-channel MOSFET 6 turned on. If the first switching element 2 is turned off later, the drain potential of the n-channel MOSFET 6 will be increased. However, the gate potential of the n-channel MOSFET 6 increases in accordance with the increase of the drain potential. This maintains the turned-on condition of the n-channel MOSFET 6. Moreover, when the n-channel MOSFET 6 is turned off, the second driving signal entered from the terminal T2 is a voltage signal having an electric potential lower than that of the above-described higher-level voltage signal (e.g., a voltage signal equivalent to the lower-voltage potential of the DC power source BT). No current flows into the control terminal (i.e., gate) of the n-channel MOSFET 6 via the charging element 10. In this case, the electric charge stored in the capacitor of the n-channel MOSFET 6 is discharged by the discharge element 12. Thus, the n-channel MOSFET 6 is promptly deactivated.

The driving apparatus shown in FIG. 1B is applicable to the p-channel MOSFET used as the second switching element 6. When the first switching element 2 is turned on, the drain (i.e., the first output terminal) of the p-channel MOSFET 6 is connected to the terminal Ta (i.e., the higher-voltage side of the DC power source BT) via the first switching element 2. In other words, the drain of the p-channel MOSFET 6 has the same electric potential as that of the higher-voltage side of the DC power source BT. A parasitic diode is formed between the output terminals (i.e., drain-source) of the p-channel MOSFET 6. Therefore, the source (i.e., the second output terminal) of the p-channel MOSFET 6 has substantially the same electric potential as that of the lower-voltage side of the DC power source BT. The second driving signal entered from the terminal T2 is a voltage signal having an electric potential equal to or lower than a value obtained by subtracting the threshold voltage $V_{TH}$ of the p-channel MOSFET 6 from the higher-voltage potential of the DC power source BT. In response to the input of the second driving signal, current flows from the control terminal (i.e., gate) of the p-channel MOSFET 6 via the charging element 10 when the first switching element 2 is turned on. This decreases the gate potential to a lower level equal to or lower than a value equivalent to the source potential minus threshold voltage $V_{TH}$. Thus, the p-channel MOSFET 6 is turned on. An electric charge is stored in the capacitor of the p-channel MOSFET 6 to keep the p-channel MOSFET 6 turned on. If the first switching element 2 is turned off later, the drain potential of the p-channel MOSFET 6 will be decreased. However, the gate potential of the p-channel MOSFET 6 decreases in accordance with the decrease of the drain potential. This maintains the turned-on condition of the p-channel MOSFET 6. Moreover, when the p-channel MOSFET 6 is turned off, the second driving signal entered from the terminal T2 is a voltage signal having an electric potential higher than that of the above-described lower-level voltage signal (e.g., a voltage signal equivalent to the higher-voltage potential of the DC power source BT). No current flows from the control terminal (i.e., gate) of the p-channel MOSFET 6 via the charging element 10. In this case, the electric charge stored in the capacitor of the p-channel MOSFET 6 is discharged by the discharge element 12. Thus, the p-channel MOSFET 6 is promptly deactivated.

As described above, the charging element 10 is provided to charge the capacitor of MOSFET for turning MOSFET 6 on. The function of the charging element 10 can be realized by directly providing a rectifying element between the input terminal T2 of the second driving signal and the control terminal (i.e., gate) of MOSFET 6. It is also possible to provide a third switching element between the DC power source BT and the control terminal (i.e., gate) of the MOSFET 6. When the voltage signal is entered as the second driving signal, current flows through the third switching element in a predetermined direction (i.e., from the higher-voltage side of DC power source to the gate, or from the gate to the lower-voltage side of DC power source) for turning MOSFET 6 on.

First Embodiment

Figure 2:
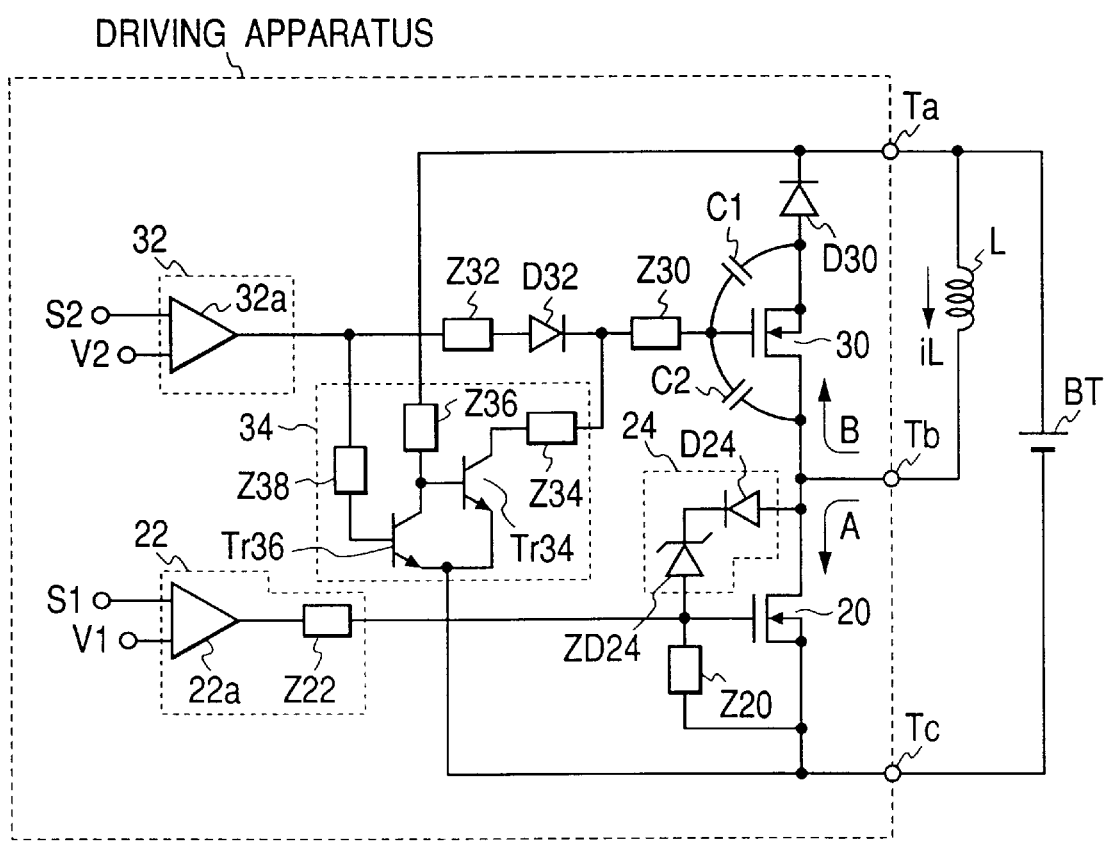
FIG. 2 is a detailed block diagram showing an inductive load driving apparatus in accordance with a first embodiment of the present invention.

FIG. 2 is a circuit diagram showing an arrangement of an inductive load driving apparatus in accordance with a first embodiment of the present invention.

As shown in FIG. 2, the driving apparatus of the first embodiment comprises an n-channel MOSFET 20 (abbreviated FET 20, hereinafter) as the first switching element which is provided in a power supply route extending from a DC power source BT to an inductive load L. FET 20 has a source connected to a lower-voltage side of the DC power source BT via a terminal Tc. Furthermore, FET 20 has a drain connected to one end of the inductive load L via a terminal Tb. Accordingly, FET 20 functions as a lower-side switch allowing load current iL to flow along a current flow route A extending from the inductive load L to the terminal Tc.

Furthermore, a driving circuit 22 is connected to a gate of FET 20. The driving circuit 22 includes a comparator 22*a* which compares an entered control signal S1 with a reference voltage V1. When the control signal S1 is equal to or larger than the reference voltage V1, the comparator 22*a* produces a high-level driving signal via an impedance element Z22, such as a resistor. This high-level driving signal turns FET 20 on.

A clamping circuit 24 is connected between the gate and drain terminals of FET 20. The clamping circuit 24 clamps the voltage Vb-c (i.e., a voltage between the terminals Tb and Tc) to a value equal to or lower than the first clamp voltage.

The clamping circuit 24 comprises a diode D24 whose anode is connected to the drain of FET 20. The clamping circuit 24 further comprises a Zener diode ZD24 having a cathode connected to a cathode of the diode D24. An anode of Zener diode ZD24 is connected to the gate of FET 20. The first clamp voltage $V_{CL1}$ is defined by a sum of a breakdown voltage $V_{ZD24}$ of Zener diode ZD24, a forward voltage drop $V_{D24}$ at the diode D22, and a threshold voltage $V_{TH20}$ of FET 20 (i.e., $V_{CL1}=V_{ZD24}+V_{D24}+V_{TH20}$).

When the voltage Vb-c (i.e., a voltage between the terminals Tb and Tc) becomes equal to or larger than the first clamp voltage $V_{CL1}$, the clamping circuit 24 activates FET 20. The load current iL flows along the current flow route A in the same manner as in the driving operation of the inductive load L. Thus, the voltage Vb-c is clamped to a value equal to or smaller than the first clamp voltage.

An impedance element Z20, such as a resistor or a constant-current source, is connected between the gate and source terminals of FET 20. The impedance element Z20 has a function of preventing malfunctions of FET 20 derived from noises etc, thereby stabilizing an operation of FET 20. However, the impedance element Z20 and the impedance element Z22 incorporated in the above-described driving circuit 22 can be omitted.

The inductive load L is connected to the higher-voltage side of the DC power source BT at a terminal Ta. A diode D30 serving as a rectifying means and an n-channel MOSFET 30 (abbreviated FET30, hereinafter) are serially connected between the terminals Ta and Tb. The diode D30 has a cathode connected to the terminal Ta. An anode of the diode D30 is connected to a source of FET 30. A drain of FET 30 is connected to the terminal Tb. Accordingly, when FET 30 is turned on, a current flow route B. is formed from the terminal Tb to the terminal Ta by setting the electric potential of terminal Tb to a value higher than the electric potential of terminal Ta.

Next, FET 30 has a gate connected to a driving circuit 32 via an impedance element Z30 (e.g., a resistor), a diode D32 and an impedance element Z32 (e.g., resistor).

The driving circuit 32 includes a comparator 32*a* which compares an entered control signal S2 with a reference voltage V2. When the control signal S2 is equal to or larger than the reference voltage V2, the comparator 32*a* produces a-high-level driving signal. The diode D32, serving as a charging means, has an anode connected to an output terminal of the driving circuit 32 via the impedance element Z32. A cathode of the diode D32 is connected to the gate of FET 30 via the impedance element Z30. The diode D32 has a function of charging a parasitic capacitor C1 formed between the gate and source terminals of FET 30 and a parasitic capacitor C2 formed between the gate and drain terminals of FET 30. More specifically, when FET 20 is turned on and the terminal Tb (i.e., the gate potential of FET 30) is low, current flows into the gate of FET 30 in response to a high-level driving signal produced from the driving circuit 32, thereby charging the parasitic capacitors C1 and C2

Furthermore, a discharging circuit 34 is connected to a connecting point between the cathode of diode D32 and the impedance element Z30. The discharging circuit 34 has a function of discharging the electric charge stored in the parasitic capacitors C1 and C2 of FET 30 in response to a low-level driving signal generated from the driving circuit 32. The discharging circuit 34 includes an NPN transistor Tr34 and an NPN transistor Tr36. A collector of NPN transistor Tr34 is connected via an impedance 34 (e.g., resistor) to the above-described connecting point between the cathode of diode D32 and the impedance element Z30. An emitter of NPN transistor Tr34 is connected to the terminal Tc. Furthermore, NPN transistor Tr34 has a base connected to the terminal Ta via an impedance Z36 (e.g., resistor). On the other hand, a collector of NPN transistor Tr36 is connected to the base of NPN transistor Tr34. An emitter of NPN transistor Tr36 is connected to the terminal Tc. Furthermore, NPN transistor Tr36 has a base connected to the output terminal of the driving circuit 32 via an impedance Z38 (e.g., resistor).

With the above-described circuit arrangement, the discharging circuit 34 functions in the following manner. When the driving circuit 32 produces a low-level driving signal, NPN transistor Tr36 is turned off and NPN transistor Tr34 is turned on. This forms a discharge route extending from the gate of FET 30 to the terminal Tc via the impedance elements Z30, Z34, NPN transistor Tr34. On the contrary, when the driving circuit 32 produces a high-level driving signal, NPN transistor Tr36 is turned on and NPN transistor Tr34 is turned off. This interrupts (i.e., opens) the discharge route. Accordingly, when the low-level driving signal is generated from the driving circuit 32, the electric charge stored in the parasitic capacitor of FET 30 is discharged to turn FET 30 off.

Next, an operation of the inductive load driving apparatus of the above-described first embodiment will be explained based on an open/close control of an electromagnetic valve serving as the inductive load L, with reference to a time chart shown in FIG. 3. In the time chart of FIG. 3, "iA" represents part of the load current iL flowing along the current flow route A formed by FET 20, and "iB" represents part of the load current iL flowing along the current flow route B formed by FET 30 and the diode D30.

To quickly open the electromagnetic value, it is necessary to supply a large amount of current in the beginning of the open control of the electromagnetic value. Furthermore, after the electromagnetic value is opened, it is preferable to supply a reduced amount of constant current to maintain the electromagnetic value open.

Figure 3:
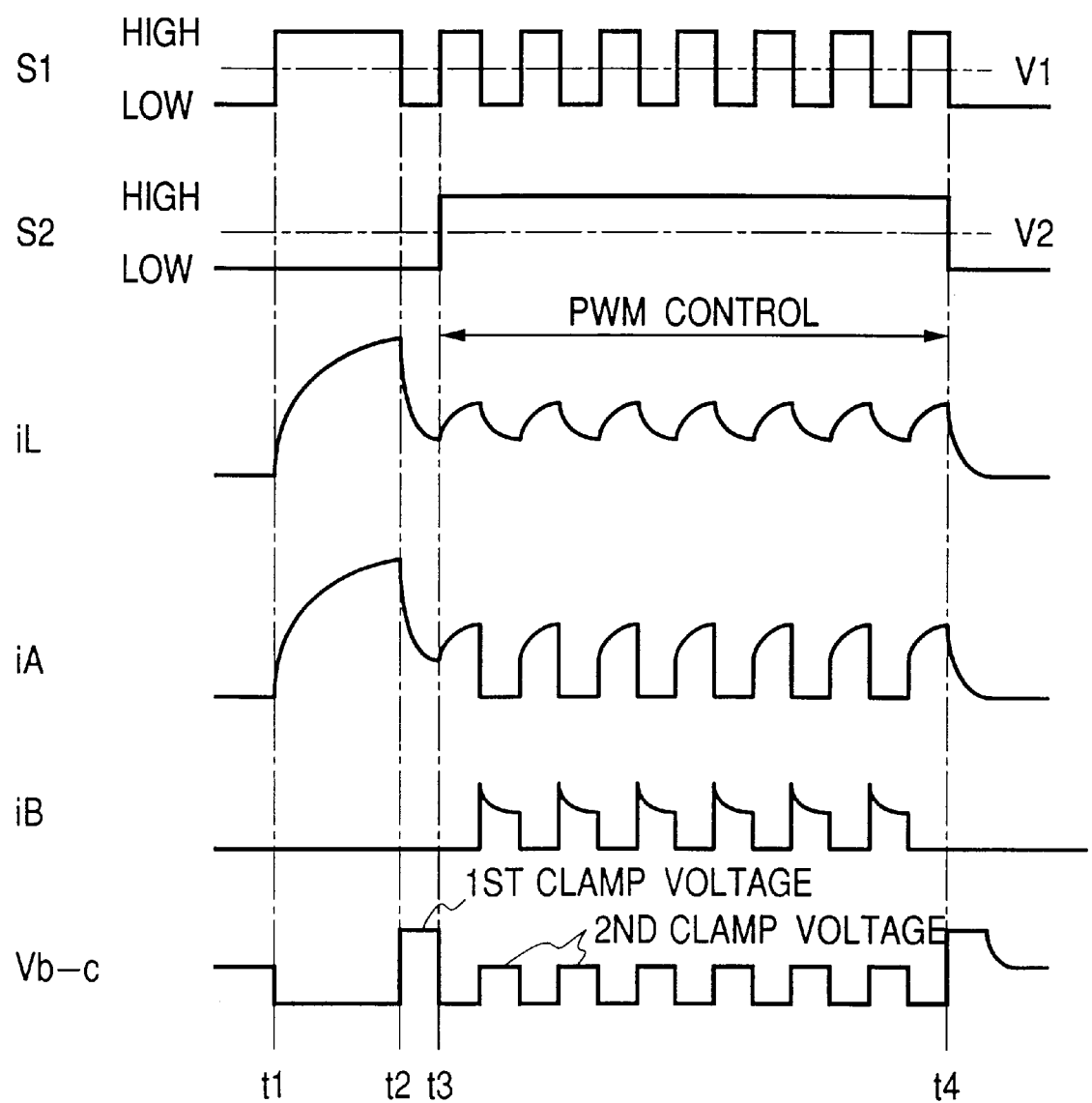
FIG. 3 is a time chart showing an operation of the inductive load driving apparatus in accordance with the first embodiment of the present invention.

First, as shown in FIG. 3, at a timing t1, the control signal S1 having an electric potential higher than the reference voltage V1 is entered into the driving circuit 22 to generate a high-level driving signal from the driving circuit 22. FET 20 is turned on in response to this high-level driving signal. In this case, the driving circuit 32 receives the control signal S2 having an electric potential lower than the reference voltage V2. Accordingly, the driving circuit 32 generates a low-level output to turn FET 30 off.

Then, the load current iL of the inductive load L starts flowing along the current flow route A. The current amount increases with a time constant determined by an inductance of the inductive load L etc. Hence, the control signal S1 is switched to a level lower than the reference voltage V1 at a timing (i.e., t2) where the load current iL reaches a predetermined current level required for opening the electromagnetic valve. Thus, FET 20 is turned off.

In this turning-off condition of FET 20, the magnetic energy stored in the inductive load L increases the electric potential of the terminal Tb of the inductive load L closer to FET 20. In other words, the voltage Vb-c between the terminals Tb and Tc is increased. At this moment, FET 30 is in a turned-off condition. Thus, by the operation of the clamping circuit 24, the load current iL flows via FET 20 continuously. The voltage Vb-c is therefore reduced to a level equal to or lower than the first clamp voltage.

Next, the reduced load current iL will reach a predetermined level (i.e., sustaining current) required for maintaining the electromagnetic valve open at a timing t3. At this moment, the control signal S1 is again changed to a higher level. The driving circuit 22 generates a high-level driving signal to turn FET 20 on. Thereafter, the level of control signal S1 is cyclically changed to feedback control the load current iL to the sustaining current so as to perform a well-known PWM control. Accordingly, FET 20 is turned on and off cyclically.

During the PWM control, the control signal S2 is increased to a level higher than the reference voltage V2. The driving circuit 32 generates a high-level driving signal. This is performed for suppressing the change of the load current iL. More specifically, when FET 20 in turned off, the voltage Vb-c between the terminals Tb and Tc is suppressed to a second clamp voltage lower than the first clamp voltage set by the clamping circuit 24. This suppresses a variation (falling down) of the load current iL appearing after FET 20 is turned off. Thus, during the PWM control, the variation of the load current iL is suppressed.

That is, as the timing t3, both the control signals S1 and S2 are changed to the higher levels. The driving circuit 32 generates the high-level driving signal to turn FET 20 on. The current flows into the gate of FET 30 from the driving circuit 32 via the diode D32. When the parasitic capacitors C1 and C2 have stored a sufficient amount of electric charge, FET 30 is turned on. During the PWM control, FET 20 is turned off cyclically. The electric potential of the terminal Tb increases correspondingly. However, by the electric charges stored in the parasitic capacitors C1 and C2, the electric potential of the gate of FET 30 is increased, too. Thus, FET 20 is kept in a turned-on condition, once FET 30 is turned on.

When the electric potential of the terminal Tb is increased in response to the turning-on of FET 30, the load current iL flows across FET 30 and diode D30 from the terminal Tb to the terminal Ta along the current flow route B. The voltage Vb-c between the terminals Tb and Tc is clamped to the second clamp voltage lower than the first clamp voltage. In this case, the first clamp voltage is defined by the power voltage VB of the DC power source BT, the forward voltage drop $V_{D30}$ at the diode D30, the on-resistance $R_{ON30}$ (i.e., drain-source resistance) of FET 30, and the load current iL. The second clamp voltage ($V_{CL2}$) is defined by an equation $V_{CL2}=V_B+VD30+R_{ON30}\times iL$. Therefore, the falling down of the load current iL appearing after starting the PWM control, is moderate compared with the rising up at the beginning of the driving operation (i.e., an opening operation of the electromagnetic valve) of the inductive load L. The load current iL is stabilized.

Next, to close the electromagnetic valve, both the control signals S1 and S2 are changed to low levels at a timing t4. Both the driving circuits 22 and 32 generate low-level driving signals. This condition is held. By producing the low-level driving signal from the driving circuit 22, FET 20 is deactivated. By producing the low-level driving signal from the driving circuit 32, the electric charges stored in the parasitic capacitors C1 and C2 of FET 30 are discharged via the discharging circuit 34. FET 30 is deactivated, too. Immediately after both of FET 20 and 30 are deactivated, the magnetic energy stored in the inductive load L increases the electric potential of the terminal Tb. This makes the clamping circuit 24 operate to allow the load current iL to flow through FET 20. Thereafter, the load current iL is reduced to 0. The voltage Vb-c between the terminals Tb and Tc terminals is equalized to the power source voltage VB of the DC power source BT.

As described in the foregoing description, the inductive load driving apparatus of the first embodiment uses the n-channel MOSFET 30 as the second switching element for changing the clamp voltage. This is advantageous to realize an inductive load driving apparatus capable of reducing the current loss. Furthermore, nevertheless the n-channel MOSFET 30 is used as the second switching element for changing the clamp voltage, the above-described first embodiment does not require a high-level driving signal having an electric potential higher than the higher-voltage side of the DC power source BT for turning the n-channel MOSFET 30 on. In other words, no special boosting (i.e., voltage increasing) circuit is required for turning n-channel MOSFET 30 on. This fairly simplifies the circuit arrangement.

In a case where the parasitic capacitors C1 and C2 of MOSFET 30 have no ability of storing a sufficient amount of electric charge for turning MOSFET 30 on, it will be desirable to provide capacitors between the gate and source terminals and the gate and drain terminals of MOSFET 30.

When the inductive load driving apparatus of the first embodiment is incorporated in a semiconductor integrated circuit to realize an IC unit, there is no necessity of enlarging the chip area for securing a sufficient amount of current flowing across the second switching element. This facilitates the realization of an IC driving apparatus. Especially, this embodiment uses the n-channel MOSFET 20 as the first switching element for controlling the power supply to the inductive load L, as well as the second switching element. The comparators 22a and 32a involved in the driving circuits 22 and 32 can be constituted by n-channel MOSFET, too. Thus, the IC driving apparatus can be easily realized.

The inductive load driving apparatus of the first embodiment needs not be embodied as an IC unit. The above-described elements can be constituted by separate components. It is needless to say that it is possible to realize an inductive load driving apparatus simple in construction and small in loss.

When the driving apparatus of the first embodiment is constituted by a semiconductor integrated circuit, it is preferable to utilize diffusion resistors as the above-described impedance elements Z20, Z22, Z30, Z32, Z34, Z36 and Z38 because the manufacturing is simplified. Regarding the impedance Z30 connected to the gate of n-channel MOSFET 30, it is preferable to use a thin film resistor to ensure the turning-on operation of the n-channel MOSFET 30. If the impedance element connected to the gate of the n-channel MOSFET 30 is constituted by a diffusion resistor, a parasitic capacitor will be formed between the gate of the n-channel MOSFET 30 and a ground terminal of the IC substrate. This parasitic capacitor may bother the turning-on operation of the n-channel MOSFET 30.

According to the above-described first embodiment, a rectifying element (i.e., diode D32) is interposed between the output terminal of the driving circuit 32 and FET 30. This rectifying element serves as the charging means for sustaining FET 30 in a turned-on condition as the second switching element. The function of the charging means required by the first embodiment is to feed the current into the gate of FET 30 to turn on FET 30 when FET 20 is activated in response to the high-level driving signal generated from the driving circuit 32. This function may be realized by arranging the gate of FET 30 to receive electric power from the DC power source BT to feed the current into the gate.

Second Embodiment

An inductive load driving apparatus in accordance with a second embodiment will be explained hereinafter, with reference to FIG. 4. The second embodiment differs from the above-described first embodiment in that the driving circuit arrangement for FET 30 is modified. The rest of the circuit arrangement is substantially the same as that of the first embodiment.

Figure 4:
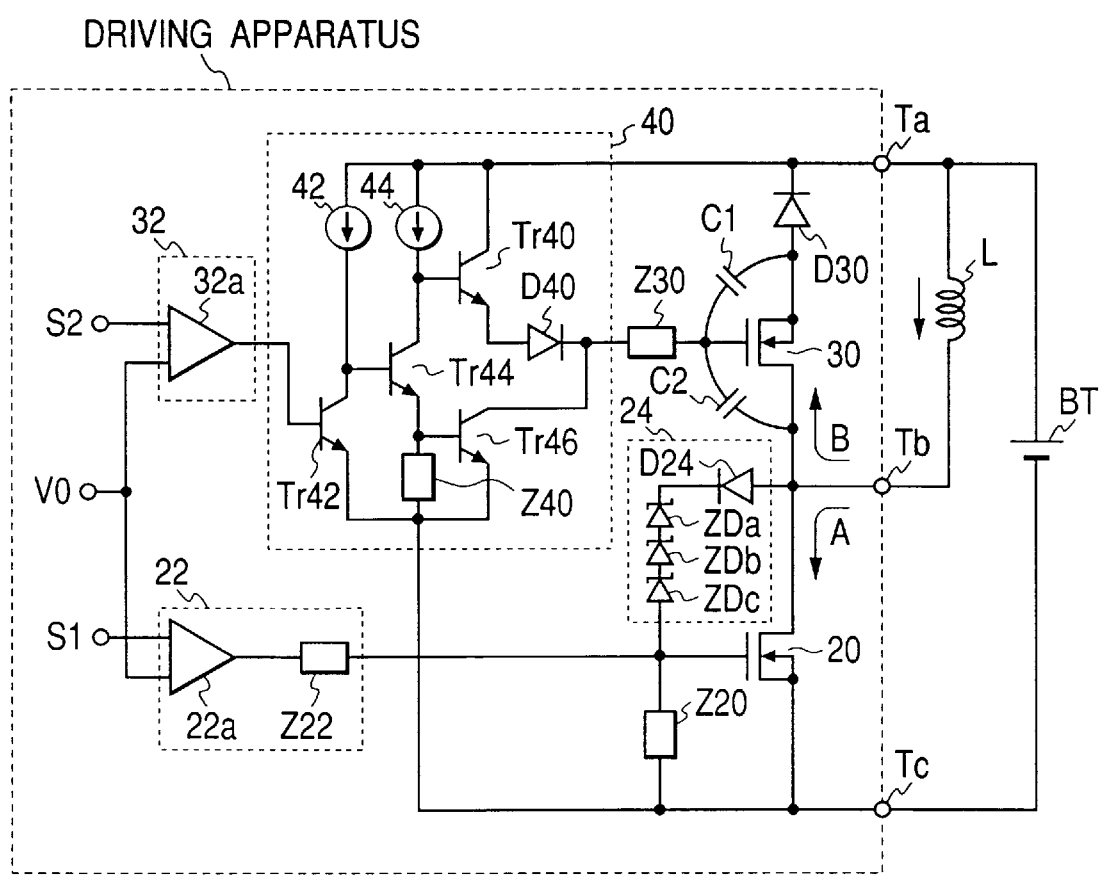
FIG. 4 is a detailed block diagram showing an inductive load driving apparatus in accordance with a second embodiment of the present invention.

As shown in FIG. 4, according to the second embodiment, the inductive load driving apparatus comprises a charge/discharge circuit 40 interposed between the driving circuit 32 and the gate of FET 30. The charge/discharge circuit 40 comprises two constant-current sources 42 and 44, NPN transistors Tr40, Tr42, Tr44 and Tr46, a diode D40, and an impedance element (e.g., resistor) Z40.

In this charge/discharge circuit 40, a collector of NPN transistor Tr40 is connected to the higher-voltage side of the DC power source BT via the terminal Ta. An emitter of of NPN transistor Tr40 is connected via the diode D40 to one end of the impedance element Z30. The other end of the impedance element Z30 is connected to the gate of FET 30. When the NPN transistor Tr40 is turned on, current flows into the gate of FET 30 from the DC power source BT via NPN transistor Tr40, diode D40 and impedance element Z30. FET 30 is turned on. And, the parasitic capacitors C1 and C2 are charged by the supplied current. Accordingly, the NPN transistor Tr40 and the diode D40 of the second embodiment can function as a charging means for charging the parasitic capacitors C1 and C2 of FET 30. The NPN transistor Tr40 corresponds to a claimed third switching element. The diode D40 prevents the current from flowing from FET 30 to the NPN transistor Tr40. However, the diode D40 may be omitted when the NPN transistor Tr40 has a sufficiently large withstand voltage.

A connecting point between the diode D40 and the impedance element Z30 is connected to a collector of NPN transistor Tr46. An emitter of NPN transistor Tr46 is connected via the terminal Tc to the lower-voltage side of the DC power source BT. Accordingly, when the NPN transistor Tr46 is turned on, a discharge route is formed in the same manner as in the first embodiment. The electric charges stored in the parasitic capacitors C1 and C2 of FET 30 are discharged. FET 30 is turned off. The impedance element Z40 is interposed between the base and emitter terminals of NPN transistor Tr46.

Furthermore, a base of NPN transistor Tr42 is connected to the output terminal of the driving circuit 32. A collector of NPN transistor Tr42 is connected to the constant-current source 42. The constant-current source 42 receives electric power from the DC power source BT and supplies constant current. An emitter of NPN transistor Tr42 is connected to the terminal Tc. A base of NPN transistor Tr44 is connected to the collector of NPN transistor Tr42. A collector of NPN transistor Tr44 is connected to the constant-current source 44. The constant-current source 44 receives electric power from the DC power source BT and supplies constant current. Furthermore, the collector of NPN transistor Tr44 is connected to the base of NPN transistor Tr40. An emitter of NPN transistor Tr44 is connected to the base of NPN transistor Tr46.

According to the charge/discharge circuit 40, NPN transistor Tr42 is turned on and NPN transistor Tr44 is turned off in response to a high-level driving signal supplied from the driving circuit 32. In response to this switching, the charging NPN transistor Tr40 is turned on and the discharging NPN transistor Tr46 is turned off. When the driving circuit 32 generates a low-level driving signal, NPN transistor Tr42 is turned off and NPN transistor Tr44 is turned on. In this case, the charging NPN transistor Tr40 is turned off and the discharging NPN transistor Tr46 is turned on.

Therefore, the driving apparatus of the second embodiment functions in the same manner as the driving apparatus of the first embodiment. That is, FET 30 is turned on by generating the high-level driving signal from the driving circuit 32. FET 30 is turned off by generating the low-level driving signal from the driving circuit 32. Thus, the same effects will be obtained.

As apparent from FIG. 4, the second embodiment differs from the first embodiment in that a same voltage V0 is entered as the reference voltage to the driving circuits 22 and 32 and in that the clamping circuit 24 is constituted by a total of three Zener diodes ZDa to ZDc and the diode D24. However, the driving apparatus of the second embodiment functions in the same manner as that of the first embodiment.

The present invention is not limited to the above-described embodiments, and therefore can be modified variously.

For example, the above-described n-channel MOSFET used as the first switching element for controlling the power supply to the inductive load L can be replaced by an NPN transistor or any other switching element when it gives no adverse influence to the manufacturing or operation of the driving apparatus.

Furthermore, according to the above-described embodiments, the clamping circuit 24 comprises a serial connection of the current-direction restricting diode and the clamp voltage setting Zener diode(s), which is connected between the gate and drain terminals of FET 20. However, any other clamping circuit can be used as the clamp means when it can hold the voltage between the terminals Tb and Tc at a value equal to or smaller than the first clamp voltage. It is also possible to directly provide the clamp circuit between the terminals Tb and Tc.

Furthermore, the above-described embodiments adopt the diodes as a rectifying means for restricting the current direction during the turned-on condition of FET 30 or as a rectifying element constituting the charging circuit.

However, these diodes can be replaced by other equivalent components. Furthermore, according to the above-described embodiments, the impedance element Z30 (and Z32, Z34 in the first embodiment) is provided to restrict the current amount in the current flow route for charging/discharging the parasitic capacitors C1 and C2 of FET 30. However, this impedance element Z30 (and Z32, Z34) can be omitted.

Another Inductive Load Driving Apparatus

Figure 5:
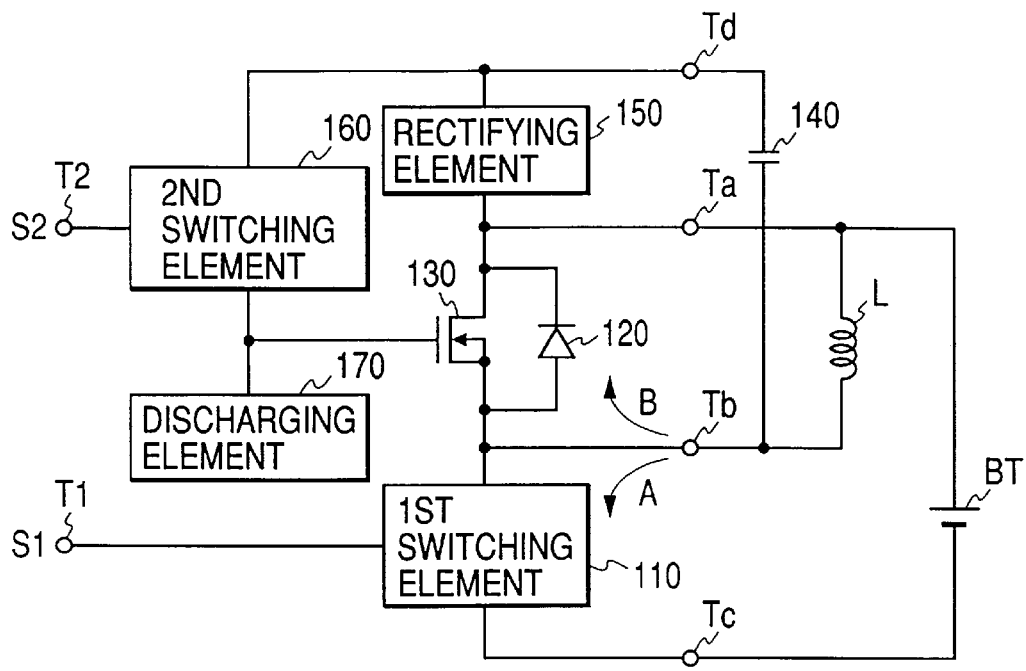
FIGS. 5 and 6 are schematic block diagrams respectively showing an arrangement of another inductive load driving apparatus in accordance with the present invention.
Figure 6:
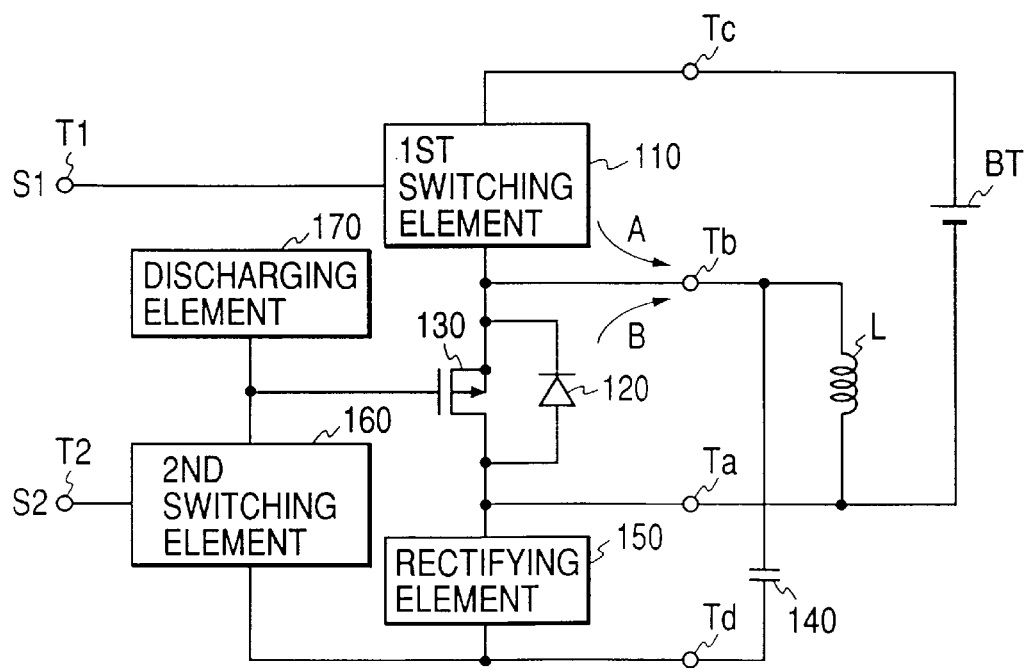

FIGS. 5 and 6 respectively show a schematic arrangement of another inductive load driving apparatus in accordance with the present invention.

As shown in FIG. 5, a power supply route extends from a DC power source BT to an inductive load L. A first switching element 110 is provided for opening or closing this power supply route in accordance with a first driving signal S1. A rectifying element 120 is connected in parallel with the inductive load L. When the first switching element 110 is turned off, no electric power is supplied to the inductive load L from the DC power source BT. However, a voltage is produced at one side (i.e., a terminal Tb) of the inductive load L closer to the first switching element. By the produced voltage, the rectifying element 120 allows current to flow across the inductive load L even when the first switching element 110 is turned off.

According to this driving apparatus, a first driving signal S1 entered from a terminal T1 is supplied to a control terminal of the first switching element 110 to activate or deactivate the first switching element 110. In response to the on/off of the first switching element 110, the current flow route of the load current flowing across the inductive load L is switched alternately between a current flow route A including the first switching element 110 and a current flow route B including the rectifying element 120. This realizes a constant-current chopper driving operation for the inductive load L.

Both ends of the rectifying element 120 are connected to a pair of output terminals, i.e., drain and source, of a MOSFET 130 (FIG. 5 shows an n-channel MOSFET). The end (i.e., terminal Tb) of the inductive load L closer to the first switching element 110 is connected to one end of a first capacitance element 140 which is capable of storing electric charge. The other end of the first capacitance element 140 is connected to one end of a rectifying element 150.

The rectifying element 150 receives electric power from the DC power source BT when the first switching element 110 is turned on. The current flowing across the rectifying element 150 charges the first capacitance element 140. The other end of the rectifying element 150 is connected to the other end (i.e., a terminal Ta between the DC power source BT and the first switching element 110) of the inductive load L.

When the first switching element 110 is turned on to supply the electric power to the inductive load L from the DC power source BT, the terminal Tb of the inductive load L is connected via the first switching element 110 to the DC power source BT. Thus, the electric potential of the terminal Tb is equalized with an electric potential of one electrode (i.e., a negative electrode in FIG. 5) of the DC power source. The terminal Tb is connected to one end of the first capacitance element 140. The other end (i.e., a terminal Td) of the first capacitance element 140 is connected via the rectifying element 150 to the other terminal Ta. The terminal Ta is connected to the other electrode (i.e., a positive electrode in FIG. 5) of the DC power source BT. Thus, when the first switching element 110 is turned on, current flows into the first capacitance element 140 from the DC power source BT via the rectifying element 150. The first capacitance element 140 is charged up to a voltage level "$V_{BT}$-Vf" where $V_{BT}$ represents a power voltage of the DC power source BT and Vf represents a voltage drop at the rectifying element 150.

A connecting point (i.e., terminal Td) between the rectifying element 150 and the first capacitance element 140 is connected to one output terminal of a second switching element 160. A control terminal (i.e., gate) of MOSFET 130 is connected to the other output terminal of the second switching element 160. The second switching element 160 is turned on in response to a second driving signal S2 entered from the terminal T2 to the control terminal of the second switching element 160, when the first switching element 110 is turned off. The second switching element 160 turns on MOSFET 130 by applying a voltage to the control terminal (i.e., gate) of MOSFET 130. In this case, the voltage applied to the control terminal (i.e., gate) of MOSFET 130 is supplied from the first capacitance element 140 which stores electric charge when the first switching element 110 is turned on.

That is, when the first switching element 110 is turned off, no current flows across the inductive load L from the DC power source BT. The connecting point (i.e., terminal Tb) between the inductive load L and the first switching element 110 has an electric potential different. (higher in FIG. 5) from a value in the condition where the first switching element 110 is turned on. However, as one end of the first capacitance element 140 is connected to the terminal Tb, the electric potential of the terminal Td varies in the same manner as the that of the terminal Tb.

For example, in the driving apparatus shown in FIG. 5, the electric potential of the terminal Tb causes a variation $\Delta V_{Tb}$ in response to a transition of the first switching element 110 from on state to off state. In this case, the electric potential $V_{Td}$ of the terminal Td can be expressed by an equation $V_{Td}$ =$V_{BT}$-Vf+$\Delta V_{Tb}$. The voltage drop Vf caused between both ends of the rectifying element 150 during the charging operation of the first capacitance element 140 is very small compared with the power source voltage $V_{BT}$. The variation $\Delta V_{Tb}$ is substantially equal to the power source voltage $V_{BT}$. Accordingly, the electric potential $V_{Td}$ of the terminal Td can be roughly expressed by an equation $V_{Td}$=2$V_{BT}$. Thus, the electric potential of the terminal Td is increased in response to the switching of the first switching element 110 from on to off up to a level substantially identical with two times the positive electrode potential of the DC power source BT.

In the driving apparatus shown in FIG. 5, to turn MOSFET 130 on, the gate potential of MOSFET 130 needs to be increased to a level higher than the potential of the terminal Tb by an amount equivalent to a threshold voltage of MOSFET 130. Furthermore, to turn MOSFET 130 on from a condition the first switching element 110 is turned off to form the current flow path B including the rectifying element 120, there is a necessity of increasing the potential of the control terminal (i.e., gate) of MOSFET 130 to a level higher than the positive electrode potential of the DC power source BT by an amount equal to or larger than the threshold voltage of MOSFET 130.

Hence, the present invention turns on MOSFET 130 by using electric charge stored in the first capacitance element 140. That is, when the first switching element 110 is turned on, the first capacitance element 140 is charged from the power source BT. The electric charge stored in the first capacitance element 140 is supplied from the terminal Td as an output voltage of first capacitance element 140. The voltage of the terminal Td is applied to the control terminal (i.e., gate) of MOSFET 130 via the second switching element 160. Thus, MOSFET 130 is turned on. As a result, the first switching element 110 is turned off. When the load current flows along the current flow route B including the rectifying element 120, a voltage produced between both ends of the rectifying element 120 can be reduced greatly. This is effective to suppress heat generation from the rectifying element 120.

Furthermore, this driving apparatus includes a discharging element 170 which turns MOSFET 130 off. More specifically, when the second driving signal S2 is not entered from the terminal T2, the second switching element 160 is turned off. In this condition, the discharging element 170 discharges electric charge stored between the control terminal and respective output terminals of MOSFET 130. The electric charge of MOSFET 130 is stored during a turned-on condition of the second switching element 160 by the application of the above-described voltage of the terminal Td.

The discharge element 170 has a function of preventing current from the positive electrode of the DC power source BT to the negative electrode via MOSFET 130 and the first switching element 110. That is, the discharge element 170 promptly deactivates MOSFET 130 as soon as the second driving signal S2 is not supplied. When the first driving signal S1 is entered later to turn the first switching element 110 on, both MOSFET 130 and the first switching element 110 are turned on simultaneously.

Thereafter, when the first driving signal S1 is entered to turn the first switching element 110 on, the load current flows along the current flow route A extending from the DC power source BT to the inductive load L. thus, the first capacitance element 140 is again charged via the rectifying element 150.

As explained in the foregoing description, the inductive load driving apparatus shown in FIG. 5 includes the rectifying element 120. The load current flows across the rectifying element 120 by the magnetic energy of the inductive load L stored during a turned-off condition of the first switching element 110. The rectifying element 120 is connected in parallel with MOSFET 130. When the first switching element 110 is turned off, MOSFET 130 can be turned on by entering the second driving signal S2 from the terminal T2 to the control terminal of MOSFET 130.

According to the inductive load driving apparatus shown in FIG. 5, the first driving signal S1 and the second driving signal S2 are alternately entered from terminals T1 and T2 to the control terminals of the first switching element 110 and the second switching element 160, to alternately activate the first switching element 110 and the second switching element 160. When the first switching element 110 is turned off, the load current flows along the current flow route B. However, the voltage produced between both terminals of the rectifying element 120 is greatly reduced by MOSFET 130. Thus, it becomes possible to suppress the heat generation from the rectifying element 120. This makes it possible to incorporate the rectifying element 120 into an IC unit.

The inductive load driving apparatus shown in FIG. 5 uses MOSFET 130 for reducing the voltage between both ends of the rectifying element 120 when the load current flows across the rectifying element 120. The reason why MOSFET 130 is used is that, if a bipolar transistor is used, there is a necessity of increasing a chip area of the bipolar for obtaining a sufficient amount of current flowing across the bipolar transistor. Using MOSFET 130 is effective to reduce the voltage between both ends of the rectifying element 120 and suppress the heat generation from the rectifying element 120. Thus, the driving apparatus can be easily incorporated into an IC unit.

Furthermore, to turn MOSFET 130 on when the first switching element 110 is turned off, the second switching element 160 supplies a voltage to the control terminal (i.e., gate) of MOSFET 130. This voltage is obtained from the first capacitance element 140 which is charged up to the power source voltage $V_{BT}$ via the rectifying element 150 when the first switching element 110 is turned on. Accordingly, no boosting (i.e., voltage increasing) circuit is required for increasing the power source voltage $V_{BT}$ to turn MOSFET 130 on. This significantly simplifies the circuit arrangement.

According to the driving apparatus shown in FIG. 5, MOSFET 130 is connected in parallel with the rectifying element 120. However, a parasitic diode is formed between output terminals (i.e., source-drain) of MOSFET 130 when MOSFET 130 is manufactured. Therefore, it is preferable to utilize this parasitic diode as the rectifying element 120. No special rectifying means is required as the rectifying element 120.

Furthermore, the electric potential of the terminal Td varies largely depending on the on/off of the first switching element 110. There is a possibility that the second switching element 160 may malfunction due to the potential change at the terminal Td. To eliminate such a malfunction, it is preferable to provide a second capacitance element having one end connected to the connecting point (i.e., terminal Td) between the rectifying element 150 and the first capacitance element 140 and the other end connected to the control terminal (i.e., T2) of the second switching element 160. The second capacitance element absorbs the potential change at the terminal Td and, therefore, prevents the second switching element 160 from malfunctioning due to the potential change at the connecting point between the rectifying element 150 and the first capacitance element 140.

The discharge element 170 has a function of promptly turn MOSFET 130 off in synchronism with the turning-off of the second switching element 160 in response to no entry of the second driving signal S2. This prevents both MOSFET 130 and the first switching element 110 from turning on simultaneously. For example, it is preferable to provide a third switching element in a current discharge route extending from the control terminal of MOSFET 130 (i.e., a route from the control terminal of MOSFET 130 to the terminal Tc in FIG. 5). The third switching element is turned on by a driving means when the second driving signal S2 is stopped.

This makes it possible to promptly discharge the electric charge stored in MOSFET 130 via the third switching element. The cutoff speed of MOSFET 130 is increased. This decreases a possibility that current flows from the DC power source BT to MOSFET 130 and the first switching element 110.

When the power supply to the inductive load L is controlled by the driving apparatus shown in FIG. 5, the first driving signal S1 and the second driving signal S2 are alternately entered from the terminals T1 and T2 to the control terminals of the first switching element 110 and the second switching element 160, respectively. To realize this power supply control, the control system need to produce both of the first drilling signal S1 and the second driving signal S2. A conventional control system cannot be used directly.

According to the driving apparatus shown in FIG. 5, it is preferable to provide a driving signal generator which produces the first driving signal and the second driving signal alternately at predetermined time intervals in response to the control signal entered for opening and closing the power supply route to the inductive load L. This arrangement makes it possible to directly use the conventional control system because a function required to the control system is only generating the control signal commanding on/off of the first switching element 110.

The reason why the driving signal generator provides the predetermined time interval between the generations of the first driving signal S1 and the second driving signal S2 is as follows. The first driving signal S1 is produced for turning the first switching element 110 on, while the second driving signal S2 is produced for turning the second switching element 160 on. If these driving signals S1 and S2 are alternately produced in response to the control signal without any time interval between them, there is a possibility that MOSFET 130 may be turned on before the first switching element 110 is not completely switched from on to off. On the contrary, the first switching element 110 may be turned on before MOSFET 130 is not completely switched from on to off. Providing an appropriate time interval between the generations of the first driving signal S1 and the second driving signal S2 is effective to eliminate such problems. It becomes possible to surely prevent the simultaneous activation of MOSFET 130 and the first switching element 110.

For example, the driving signal generator may comprise a charge/discharge circuit for charging and discharging the third capacitance element in accordance with the control signal. A pair of comparing circuits is provided for comparing the voltages of both ends of the third capacitance element with first and second reference voltages different each other.

The driving apparatus shown in FIG. 5 adopts an n-channel MOSFET as MOSFET 130 connected to the rectifying element 120. This is because the first switching element 110 is provided as a so-called lower-side switch provided between the inductive load L and the negative electrode of the DC power source BT.

FIG. 6 shows an inductive load driving apparatus comparable with the inductive load driving apparatus shown in FIG. 5 but is applicable to a so-called higher-side switch. According to the driving apparatus shown in FIG. 6, the first switching element 110 is provided between the inductive load L and the positive electrode of the DC power source BT. A p-channel MOSFET is used as MOSFET 130. The driving apparatus shown in FIG. 6 has substantially the same functions and effects as those of the driving apparatus shown in FIG. 5. Thus, the present invention can be applied to both of the lower-side and higher-side switches.

In the driving apparatus shown in FIG. 6 wherein the first switching element 110 is provided as a higher-side switch, the first capacitance element 140 is charged in such a manner that an electric potential of the terminal Td becomes lower than an electric potential of the terminal Tb. When the first switching element 110 is turned off, the electric potential of the terminal Td is reduced to a level lower than the potential of the positive electrode (Tc) of the DC power source BT by an amount equal to two times the power source voltage $V_{BT}$. This negative potential is applied to the control terminal (i.e., gate) of MOSFET 130 via the second switching element 160, thereby turning MOSFET 130 on.

Third Embodiment

A third embodiment of the present invention will be explained with reference to FIGS. 7, 8A and 8B.

Figure 7:
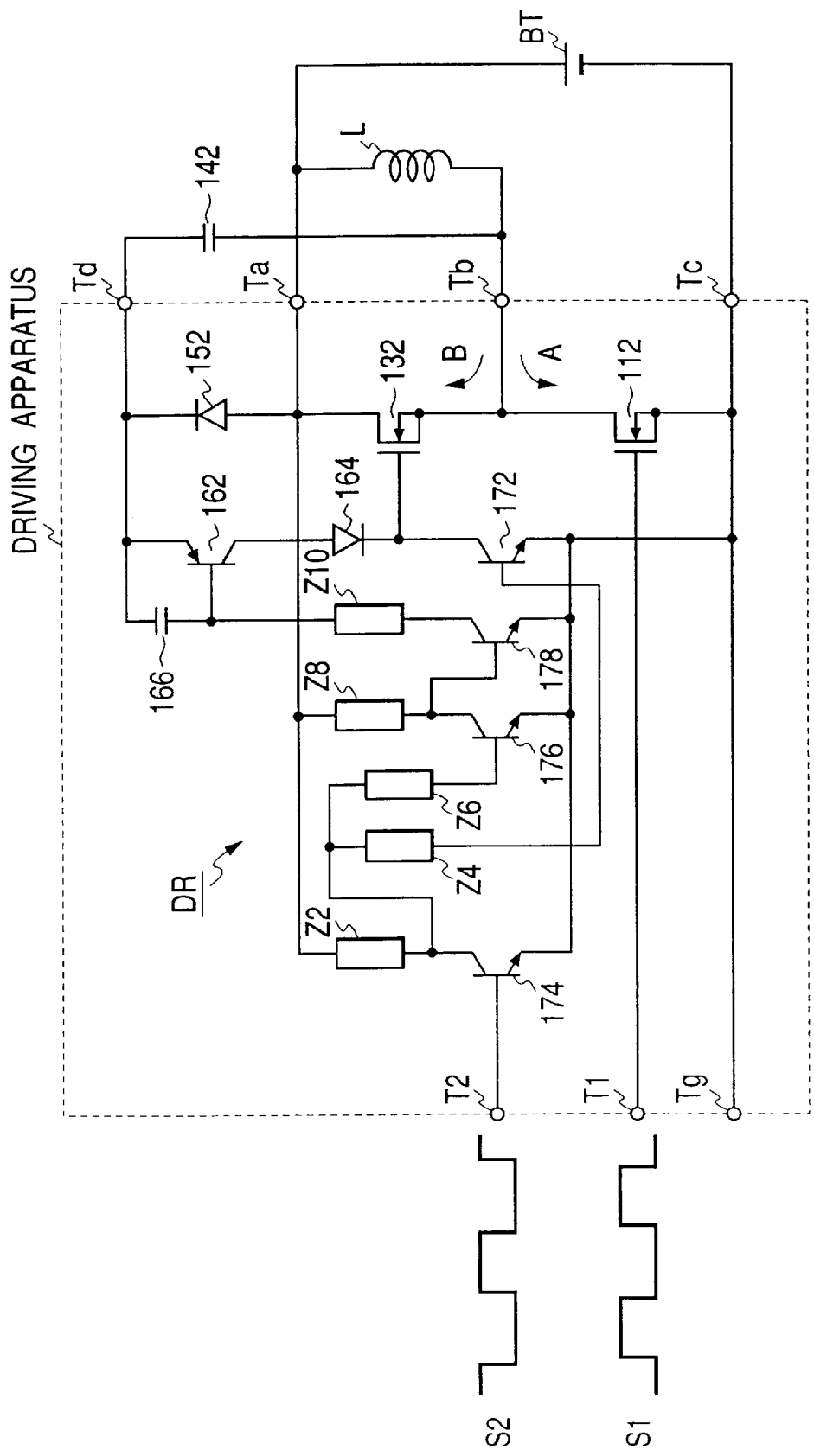
FIG. 7 is a detailed block diagram showing an inductive load driving apparatus in accordance with a third embodiment of the present invention.

As shown in FIG. 7, an n-channel MOSFET 112 (abbreviated FET 112, hereinafter) is provided as the first switching element (i.e., lower-side switch) having one end connected via the terminal Tb to the inductive load L and the other end connected via the terminal Tc to the negative electrode of the DC power source BT. An n-channel MOSFET 132 (abbreviated FET 132, hereinafter) is provided between terminals Ta and Tb. The terminal Ta is connected to a connecting point between the inductive load L and the positive electrode of the DC power source BT. When FET 112 is turned off, FET 132 forms a current flow route B so that current flows across the inductive load L by a positive higher voltage of the terminal Tb. The positive higher voltage of the terminal Tb is produced when a power supply route (i.e., current flow route A) to the inductive load L is opened.

FET 132, corresponding to the previously-described MOSFET 130, has one output terminal (i.e., drain) connected to the terminal Ta and the other output terminal (i.e., source) connected to the terminal Tb. A parasitic diode (not shown), formed between the drain and source terminals of FET 132, allows current to flow in a direction from the source to the drain. Accordingly, this embodiment utilizes this parasitic diode as the previously-described rectifying element 120.

A capacitor 142, serving as the previously-described first capacitance element, is connected between the terminals Td and Tb. A diode 152, serving as the above-described rectifying element 150, is provided between the terminals Td and Ta. An anode of the diode 152 is connected to the terminal Ta, while a cathode of the diode 152 is connected to the terminal Td. Thus, the diode 152 restricts the current to flow in a forward direction from the terminal Ta to the terminal Td.

Furthermore, the driving apparatus of this embodiment comprises a PNP transistor 162 serving as the previously-described second switching element. An emitter (i.e., one output terminal) of PNP transistor 162 is connected to the terminal Td. A collector (i.e., the other output terminal) of PNP transistor 162 is connected to a gate of FET 132 via a diode 164. An anode of the diode 164 is connected to the collector of PNP transistor 162. A cathode of the diode 164 is connected to the gate of FET 132. Thus, the diode 164 allows current to flow in one direction from PNP transistor 162 to the gate of FET 132. A capacitor 166, serving as the previously-described second capacitance element, is provided between the emitter and base terminals of PNP transistor 162.

Furthermore, the drain of FET 132 is connected to a collector of NPN transistor 172. An emitter of NPN transistor 172 is connected to the terminal Tc. The NPN transistor 172 serves as the previously-described discharging element 170 which discharges the electric charge stored in the capacitor between the gate and drain terminals of FET 132 when FET 132 is turned on to promptly turn FET 132 off.

Furthermore, the driving apparatus of this embodiment comprises a driving circuit DR for turning on and off NPN transistor 172 and PNP transistor 162 in response to the driving signal (i.e., the second driving signal S2) entered from the terminal T2.

The driving circuit DR comprises an NPN transistor 174 having a base connected to the terminal T2, a collector connected to the terminal Ta via an impedance Z2, and an emitter connected to the terminal Tc. An impedance Z4 is connected between the collector of NPN transistor 174 and a base of NPN transistor 172. The connector of NPN transistor 174 is connected to a base of an NPN transistor 176 via an impedance Z6. An emitter of NPN transistor 176 is connected to the terminal Tc. A collector of NPN transistor 176 is connected to the terminal Ta via an impedance Z8. The collector of NPN transistor 176 is connected to a base of NPN transistor 178. An emitter of NPN transistor 176 is connected to the terminal Tc. A collector of NPN transistor 176 is connected to the base of PNP transistor 162 via an impedance Z10. Each of the above-described impedances, constituted by a constant-current source or a resistor, has a function of limiting current flowing across each transistor.

In the above-described driving circuit DR, the positive electrode of the DC power source is connected to the terminal Ta. The negative electrode of the DC power source is connected to the terminal Tc. A signal entered from the terminal T2 is a high-level signal (i.e., second driving signal S2) having an electric potential higher than the negative-electrode potential (i.e., ground potential) of the DC power source BT. In response to the entered high-level signal, NPN transistor 174 is turned on. The base potential of NPN transistor 172 becomes the ground potential. Thus, NPN transistor 172 is turned on. In this condition, NPN transistor 176 is turned off, while NPN transistor 178 is turned on. As a result, PNP transistor 162 serving as the second switching element has the base current flowing via NPN transistor 178. Thus, PNP transistor 162 is turned on.

On the other hand, when the second driving signal S2 is stopped (i.e., an electric potential of terminal T2 is a low-level), NPN transistor 174 is turned off. NPN transistor 176 is turned on. NPN transistor 178 is turned off. The base current of PNP transistor 162 is stopped. Thus, PNP transistor 162 is turned off. In this condition, the collector of NPN transistor 174 has a high-level potential. Thus, NPN transistor 172 is turned on.

Furthermore, the gate of FET 112 serving as the first switching element is connected to the terminal T1. In this condition, FET 112 is turned on in response to a high-level driving signal (i.e., first driving signal S1) entered from the terminal T1. This high-level driving signal S1 has an electric potential higher than the ground potential by an amount equal to or larger than the threshold voltage of FET 112. When the first driving signal S1 entered from the terminal T1 is a low-level signal, FET 112 is turned off.

Accordingly, as shown in FIG. 7, driving signals S1 and S2, having opposite polarities, are alternately entered with predetermined time intervals from the terminals T1 and T2, respectively. The provision of the predetermined time intervals is effective to prevent the driving signals S1 and S2 from becoming high levels at the same time. Thus, FET 112 and PNP transistor 162 are alternately turned on at the predetermined time intervals. The switching of NPN transistor 172 is synchronized with that of PNP transistor 162. The on/off condition of PNP transistor 162 is opposed to the on/off condition of PNP transistor 162.

The driving apparatus of this embodiment comprises every components shown in FIG. 5. When FET 112 is turned on in response to the driving signals S1 and S2, the load current of the inductive load L flows from the DC power source BT along the current flow route A. In this condition, the capacitor 142 is charged up to the power source voltage VBT, When FET 112 is turned off, the current flows across the inductive load L along the current flow route B. in this condition, FET 132 is turned on by the electric potential of the terminal Td. This greatly reduces a voltage between the both ends of the rectifying element 120 constituted by the parasitic diode of FET 132. Thus, the inductive load driving apparatus of this embodiment suppresses heat generation in the current flow route B.

Furthermore, the capacitor 166 is provided between the base and emitter terminals of PNP transistor 162 serving as the second switching element. This prevents PNP transistor 162 from malfunctioning due to a potential change of the terminal Td occurring in accordance with the on/off operation of FET 112. The reliability of the driving apparatus is increased.

Especially, the diode 164 is provided between PNP transistor 162 and the gate of FET 132. This prevents FET 132 from erroneously turned off. If the diode 164 is not provided, current will flow from the gate of FET 132 to PNP transistor 162 in response to the base current of PNP transistor 162. This possibly turns FET 132 off. Such a problem will arise when the second switching element is constituted by a bipolar transistor. Thus, the driving apparatus of this embodiment can solve this kind of problems and increase the reliability.

Figure 8A:
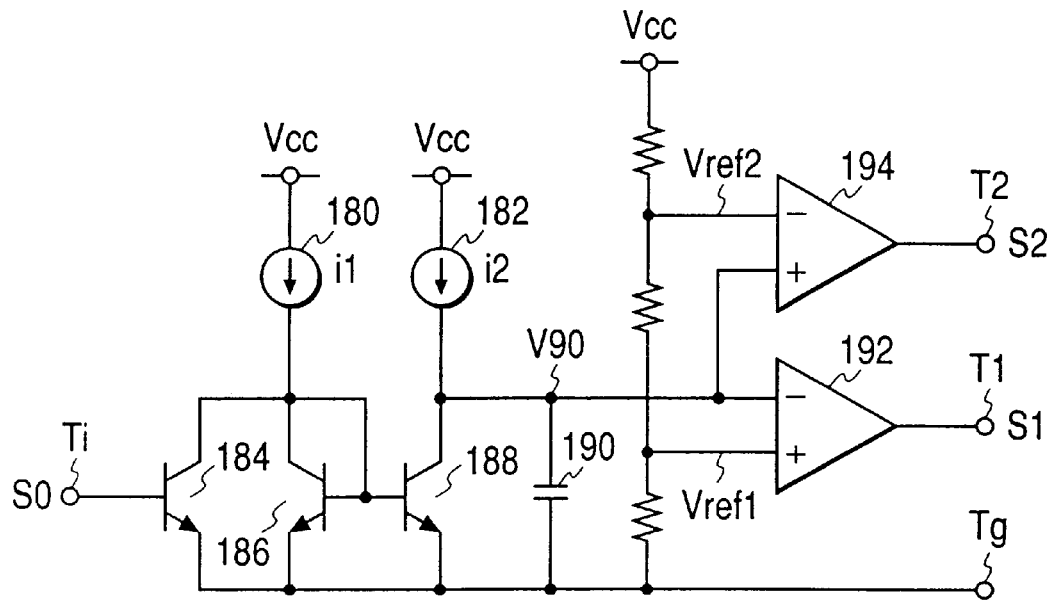
FIG. 8A is a detailed block diagram showing a driving signal generating circuit in accordance with the third embodiment of the present invention.

FIG. 8A shows a driving signal generating circuit serving as the previously-described driving signal generator. The driving signal generating circuit receives a control signal S0 supplied from the control system for activating and deactivating FET 112. The first driving signal S1 and the second driving signal S2 are produced in response to the control signal S0.

A detailed arrangement of the driving signal generating circuit will be explained with reference to FIG. 8A. The driving signal generating circuit comprises a pair of constant-current sources 180 and 182 which supply constant currents i1 and i2, respectively, when a constant voltage Vcc is given. The constant current i1 supplied from the constant-current source 180 is larger than the constant current i2 supplied from the constant-current source 182 (i.e., i1>i2).

A pair of NPN transistors 184 and 186 is provided in a current flow route extending from the constant-current source 180. Each of NPN transistors 184 and 186 has a collector connected to the constant-current source 180 and an emitter connected to a terminal Tg which has a ground potential of the driving apparatus. An NPN transistor 188 is provided in a current flow route extending from the constant-current source 182. NPN transistor 188 has a collector connected to the constant-current source 182 and an emitter connected to the terminal Tg. A capacitor 190, serving as the third capacitance element, is connected in parallel with NPN transistor 188 between the collector and emitter terminals thereof.

A base of NPN transistor 184 is connected to an input terminal Ti to which the control signal S0 is supplied from the control system. A base of NPN transistor 186 is connected to the collector of the same NPN transistor 186 and is also connected to a base of NPN transistor 188. In short, NPN transistors 186 and 188 cooperatively constitute a current-mirror circuit.

Figure 8B:
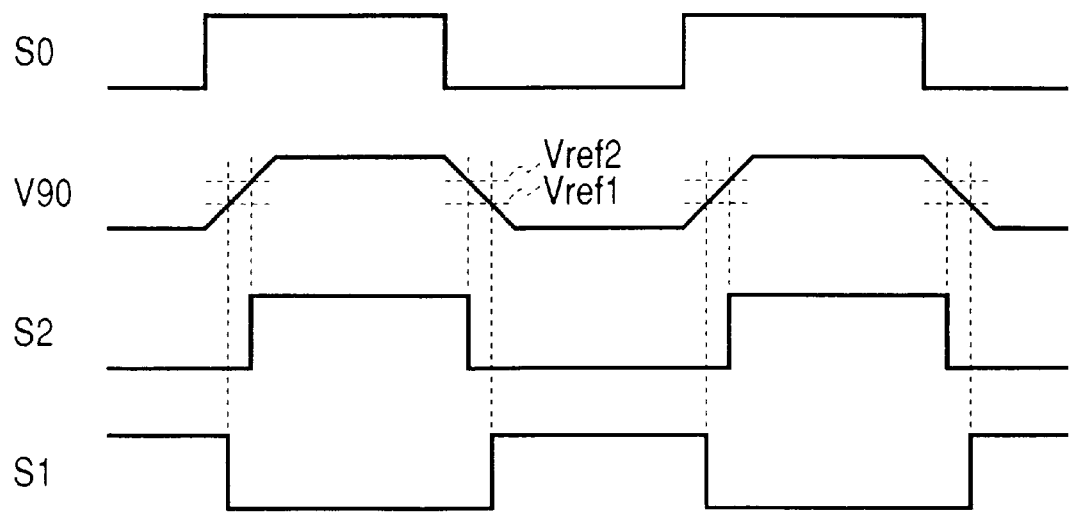
FIG. 8B is a time chart showing an operation of the driving signal generating circuit in accordance with the third embodiment of the present invention.

FIG. 8B shows a time chart explaining an operation of the inductive load driving apparatus shown in FIG. 7. When a high-level control signal S0 is entered from the input terminal Ti, NPN transistor 184 is turned on. The constant current i1 flows across the NPN transistor 184. Both of NPN transistors 186 nd 188 are turned off. The capacitor 190 is charged by the constant current i2. A voltage V90 between both ends of the capacitor 190 increases at a constant gradient and reaches the constant voltage Vcc.

On the other hand, when the control signal S0 is a low-level signal, NPN transistor 184 is turned off. The constant current i1 flows across NPN transistor 186. The same current i1 flows across NPN transistor 188. However, the constant-current source 182 has no capability of supply the current i1 to NPN transistor 188 because the current i2 supplied from the constant-current source 182 is smaller than the current i1. Thus, the shortage of the current (i.e., i1-i2) is supplied from the capacitor 190. As a result, the capacitor 190 is discharged at a constant current "i1-i2", until the voltage V90 between the both ends of the capacitor 190 is reduced to the ground potential.

Furthermore, the driving signal generating circuit comprises a pair of comparators 192 and 194. The comparator 192 compares the voltage V90 of the capacitor 190 with a first reference voltage Vref1. The comparator 194 compares the voltage V90 with a second reference voltage Vref2. The first reference voltage Vref1 and the second reference voltage Vref2 are produced by dividing the constant voltage Vcc. The first reference voltage Vref1 is smaller than the second reference voltage Vref2 (Vref1<Vref2). The comparator 192 produces a low-level signal when the voltage V90 of the capacitor 190 is larger than the first reference voltage Vref1, and produces a high-level signal when the voltage V90 is equal to or smaller than the first reference voltage Vref1. The comparator 194 produces a high-level signal when the voltage V90 of the capacitor 190 is larger than the second reference voltage Vref2, and produces a low-level signal when the voltage V90 is equal to or smaller than the second reference voltage Vref2.

Thus, the comparators 192 and 194 produce two kinds of signals alternately changed between high and low levels in response to the voltage level of the control signal S0. After one signal changed from a high level to a low level, the other signal changes from a low level to a high level with a predetermined time delay determined by a gradient of the voltage V90. Output signals of these comparators 192 and 194 are supplied to the terminals T1 and T2 as the first driving signal S1 and the second driving signal S2, respectively. Thus, it becomes possible to realize a normal operation of the driving apparatus shown in FIG. 7 without turning FET 112 and 132 on simultaneously.

Fourth Embodiment

The above-described embodiment can be modified variously.

Figure 9:
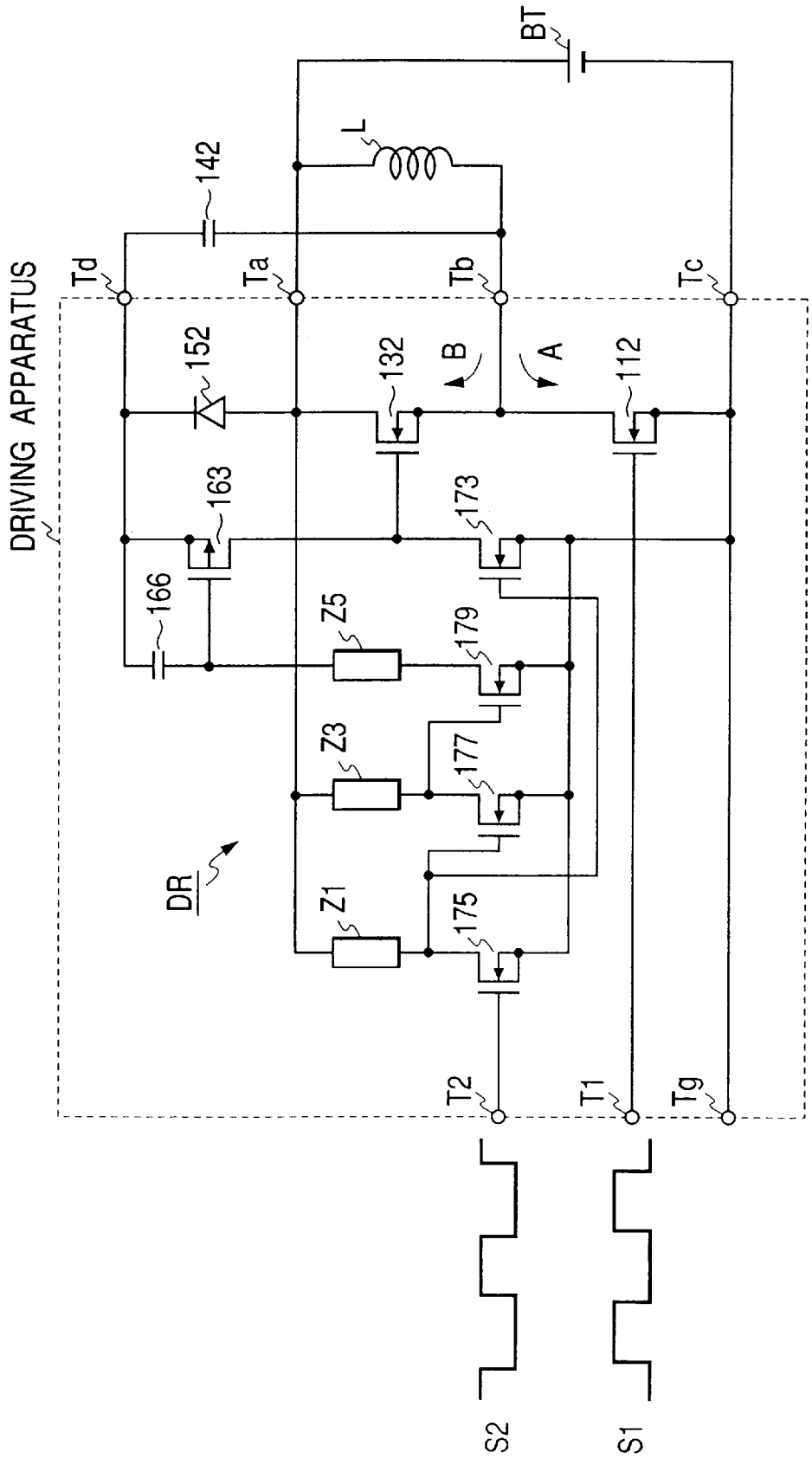
FIG. 9 is a detailed block diagram showing an inductive load driving apparatus in accordance with a fourth embodiment of the present invention.

FIG. 9 is a modified embodiment which is different from the above-described third embodiment using the second switching element and the charging switching element constituted by bipolar transistors. Namely, the driving apparatus shown in FIG. 9 comprises a p-channel MOSFET 163 (abbreviated FET 163, hereinafter) as the second switching element and an n-channel MOSFET 173 (abbreviated FET 173) as the discharging switching element. According to this modified embodiment, the driving apparatus can be constituted by using MOSFET elements only. This is advantageous in realizing an IC unit of the driving apparatus because the manufacturing can be simplified by using a single process of MOS.

In the driving apparatus shown in FIG. 9, FET 163 serving as the second switching element has a source connected to the terminal Td and a drain connected to the gate of FET 132. On the other hand, FET 173 serving as the discharging switching element has a drain connected to the gate of FET 132 and a source connected to the terminal Tc. Furthermore, the driving circuit DR comprises a total of three n-channel MOSFET elements 175, 177 and 179 (abbreviated FET 175, FET 177 and FET 179) and a total of three impedance elements Z1, Z3 and Z5. More specifically, FET 175 has a gate connected to the terminal T2, a source connected to the terminal Tc, and a drain connected to the terminal Ta via the impedance element Z1. The drain of FET 175 is further connected to the gate of FET 173. On the other hand, FET 177 has a gate connected to the drain of FET 175, a source connected to the terminal Tc, and a drain connected to the terminal Ta via the impedance element Z3. FET 179 has a gate connected to the drain of FET 177, a source connected to the terminal Tc, and a drain connected to the gate of FET 163 via the impedance element Z5.

According to the above-described modified driving apparatus shown in FIG. 9, when a high-level second driving signal S2 is entered from the terminal T2, FET 175 is turned on. FET 177 is turned off, and FET 179 is turned on. FET 163 is turned on, and FET 173 is turned off. On the contrary, when the second driving signal S2 is changed to a low-level signal, FET 175 is turned off. FET 177 is turned on, and FET 179 is turned off. FET 163 is turned off, and FET 173 is turned on. Accordingly, the driving apparatus shown in FIG. 9 operates in the same manner as the driving apparatus shown in FIG. 7.

A capacitance value Cf of the capacitor 142 is determined so as to satisfy the following condition.

$(Cf \cdot V_{BT})/(Cf+Cox) \geq V_{TH}$ where Cox represents a gate capacitance of FET 132, $V_{BT}$ represents a voltage of the DC power source BT, and $V_{TH}$ represents a threshold voltage of FET 132.

Furthermore, to ensure the turning-on operation of FET 132, it is preferable that the capacitance value Cf of the capacitor 142 is not smaller than the gate capacitance Cox of FET 132 (i.e., Cf≧Cox).

This invention may be embodied in several forms without departing from the spirit of essential characteristics thereof. The present embodiments as described are therefore intended to be only illustrative and not restrictive, since the scope of the invention is defined by the appended claims rather than by the description preceding them. All changes that fall within the metes and bounds of the claims, or equivalents of such metes and bounds, are therefore intended to be embraced by the claims.

What is claimed is:

1. An inductive load driving apparatus comprising:

a first switching element provided in a power supply route extending from a DC power source to an inductive load for opening or closing said power supply route in accordance with a first driving signal;

a clamping means for preventing a voltage between both ends of said power supply route from exceeding a first clamp voltage when said power supply route is opened in response to a turn-off of said first switching element;

a current flow route connected in parallel with said inductive load;

a second switching element for opening or closing said current flow route in response to a second driving signal;

a rectifying means for allowing current to flow along said current flow route by a voltage produced at one end of said inductive load closer to said first switching element in response to the turning-off of said first switching element, when said second switching element is turned on to change said voltage between both ends of said power supply route from said first clamp voltage to a second clamp voltage lower than said first clamp voltage, said second switching element and said rectifying element being provided in said current flow route;

said second switching element being constituted by a MOSFET having a first output terminal connected to said one end of said inductive load closer to said first switching element and a second output terminal connected via said rectifying element to the other end of said inductive load; and a charging means for allowing current to flow into a control terminal of said MOSFET when said second driving signal is a voltage signal for activating said MOSFET, and charging a capacitor formed between the output terminal and said control terminal of said MOSFET.

2. The inductive load driving apparatus in accordance with claim 1, further comprising a discharging means connected to said control terminal of said MOSFET for discharging electric charge stored in said capacitor of said MOSFET when said second driving signal is a voltage signal for deactivating said MOSFET.

3. The inductive load driving apparatus in accordance with claim 1, wherein said first switching element and said clamping means are integrated into a single switching element.

4. The inductive load driving apparatus in accordance with claim 1, wherein said first switching element is provided in a power supply route extending from said inductive load to a lower-voltage side of said DC power source, and said second switching element is an n-channel MOSFET.

5. The inductive load driving apparatus in accordance with claim 1, wherein said first switching element is provided in a power supply route extending from a higher-voltage side of said DC power source to said inductive load, and said second switching element is a p-channel MOSFET.

6. The inductive load driving apparatus in accordance with claim 1, wherein said charging means is a rectifying element provided between an input terminal of said second driving signal and said control terminal of said MOSFET.

7. The inductive load driving apparatus in accordance with claim 1, wherein said charging means comprises a third switching element provided between said DC power source and said control terminal of said MOSFET, and current flows in a predetermined direction across said third switching element when said second driving signal is a voltage signal for activating said MOSFET.

8. An inductive load driving apparatus comprising:

a first switching element provided in a power supply route extending from a DC power source to an inductive load for opening or closing said power supply route in accordance with a first driving signal;

a rectifying element connected in parallel with said inductive load for allowing current to flow across said inductive load by a voltage produced at one end of said inductive load closer to said first switching element, said voltage being produced when a power supply to the inductive load is stopped in response to a turning-off operation of said first switching element;

a MOSFET having a pair of output terminals connected to both ends of said rectifying element;

a first capacitance element for storing electric charge, one end of said first capacitance element being connected to said one end of said inductive load closer to said first switching element;

a rectifying means for allowing current to flow in a predetermined direction for charging said first capacitance element by a voltage supplied from said DC power source when said first switching element is turned on, one end of said rectifying means being connected to the other terminal of said first capacitance element, and the other terminal of said rectifying means being connected to the other end of said inductive load far from said first switching element;

a second switching element for turning said MOSFET on by applying a voltage to a control terminal of said MOSFET from a connecting point between said first capacitance element and said rectifying element, said second switching element being turned on in response to a second driving signal entered to a control terminal when said first switching element is turned on, one output terminal of said second switching element being connected to said connecting point between said first capacitance element and said rectifying means, the other output terminal of said second switching element being connected to said control terminal of said MOSFET; and a discharging means for turning said MOSFET off by discharging electric charge of said MOSFET when said second switching element is turned off in response to a stop of said second driving signal, said electric charge having been stored between said control terminal and said output terminal of said MOSFET by the application of said voltage during a turned-on condition of said second switching element.

9. The inductive load driving apparatus in accordance with claim 8, wherein said rectifying element is constituted by a parasitic diode formed between said output terminals of said MOSFET when said MOSFET is manufactured.

10. The inductive load driving apparatus in accordance with claim 8, further comprising a second capacitance element having one end connected to said connecting point between said rectifying means and said first capacitance element and the other end connected to the control terminal of said second switching element, so as to prevent said second switching element from malfunctioning due to a potential change of said connecting point between said rectifying means and said first capacitance element.

11. The inductive load driving apparatus in accordance with claim 8, wherein said discharging means comprises a third switching element provided in a discharge route of said electric charge and a driving means for causing said third switch to turn on to discharge said electric charge when said second driving signal is stopped.

12. The inductive load driving apparatus in accordance with claim 8, further comprising a driving signal generating means for alternately generating said first driving signal and said second driving signal with predetermined time delays in response to a control signal entered for opening and closing said power supply route to said inductive load.

13. The inductive load driving apparatus in accordance with claim 12, wherein said driving signal generating means comprises a charge/discharge circuit for charging and discharging a third capacitance element in accordance with said control signal, and a pair of comparators for comparing a voltage of said third capacitance element with a first reference voltage and a second reference voltage different from each other, thereby alternately producing said first driving signal and said second driving signal in response to said control signal.

14. An inductive load driving apparatus comprising:

a first switching element provided in a power supply route extending from a DC at power source to an inductive load for opening or closing said power supply route in accordance with a first driving signal;

a current route forming means connected in parallel with said inductive load for providing a current flow route allowing current to flow during a turned-off condition of said first switching element, said current route forming means including a MOSFET; and a driving circuit for activating said current route forming means in response to a second driving signal, said driving circuit including a capacitance element having one end connected to a connecting point between said inductive load and said first switching element and the other end connected to a control terminal of said MOSFET.

15. The inductive load driving apparatus in accordance with claim 14, wherein said first switching element is serially connected with said inductive load between positive and negative terminals of said DC power source.

16. The inductive load driving apparatus in accordance with claim 14, wherein said inductive load has one end connected to one of positive or negative terminals of said DC power source, and said first switching element has one end connected to the other of said positive or negative terminals of said DC power source, so that said inductive load and said first switching element are connected in series.

* * * * *

UNITED STATES PATENT AND TRADEMARK OFFICE
CERTIFICATE OF CORRECTION

PATENT NO.       : 5,977,756
DATED            : November 2, 1999
INVENTOR(S)      : NAGATA et al.

It is certified that error appears in the above-identified patent and that said Letters Patent is hereby corrected as shown below:

Title page,

Please delete:

"[*] Notice: This patent issued on a continued prosecution application filed under 37 CFR 1.53(d), and is subject to the twenty year patent term provisions of 35 U.S.C. 154(a)(2)."

Signed and Sealed this

Seventh Day of November, 2000

Attest:

Q. TODD DICKINSON

*Attesting Officer*      *Director of Patents and Trademarks*